United States Patent
Lee et al.

(10) Patent No.: US 11,121,046 B2
(45) Date of Patent: Sep. 14, 2021

(54) WAFER-LEVEL TESTING METHOD AND TEST STRUCTURE THEREOF

(71) Applicant: TAIWAN SEMICONDUCTOR MANUFACTURING COMPANY LTD., Hsinchu (TW)

(72) Inventors: Pei-Hsuan Lee, Taipei (TW); Yu-Hsuan Huang, Taichung (TW); Chia-Chia Kan, Taipei (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 93 days.

(21) Appl. No.: 16/249,315

(22) Filed: Jan. 16, 2019

(65) Prior Publication Data
US 2020/0043815 A1 Feb. 6, 2020

Related U.S. Application Data

(60) Provisional application No. 62/712,499, filed on Jul. 31, 2018.

(51) Int. Cl.
*H01L 21/66* (2006.01)
*G06T 7/00* (2017.01)
(Continued)

(52) U.S. Cl.
CPC .............. *H01L 22/32* (2013.01); *G01R 31/50* (2020.01); *G06T 7/0006* (2013.01);
(Continued)

(58) Field of Classification Search
None
See application file for complete search history.

(56) References Cited

U.S. PATENT DOCUMENTS 6,426,531 B1   7/2002  Kinugasa
6,452,412 B1 *  9/2002  Jarvis ................ G01R 31/2831
                                            324/750.3
(Continued)

FOREIGN PATENT DOCUMENTS

CN      105304614 A    2/2016
TW     201037778 A1   10/2010

OTHER PUBLICATIONS

Office Action and Search Report dated Sep. 21, 2020 issued by Taiwan Intellectual Property Administration for counterpart application No. 108120158.
(Continued)

*Primary Examiner* — Jermele M Hollington
*Assistant Examiner* — Suresh K Rajaputra
(74) *Attorney, Agent, or Firm* — WPAT, P.C.; Anthony King

(57) ABSTRACT

A method includes: coupling a first end of a first conductive trace to a free electron source; scanning exposed surfaces of the first and a second conductive traces with an electron beam, the first conductive trace and a second conductive trace being alternately arranged and spaced apart; obtaining an image of the first conductive trace and the second conductive trace while performing the scanning; and determining a routing characteristic of the first conductive trace and the second conductive trace based on the image.

20 Claims, 19 Drawing Sheets

(51) Int. Cl.
  *H01L 21/67* (2006.01)
  *G01R 31/50* (2020.01)
(52) U.S. Cl.
  CPC ........ *H01L 21/67288* (2013.01); *H01L 22/12* (2013.01); *G06T 2207/30148* (2013.01)

(56) References Cited

U.S. PATENT DOCUMENTS 6,566,885 B1 * 5/2003 Pinto ...................... G01N 21/66
  324/501
2002/0187582 A1 * 12/2002 Satya .................... H01L 23/544
  438/48

OTHER PUBLICATIONS

Office Action, Cited References and Search Report dated Apr. 7, 2021 issued by the Taiwan Intellectual Property Office for the Taiwanese counterpart application No. 108120158.

* cited by examiner

WAFER-LEVEL TESTING METHOD AND TEST STRUCTURE THEREOF

PRIORITY CLAIM AND CROSS-REFERENCE

This application claims priority to U.S. patent application Ser. No. 62/712,499 filed Jul. 31, 2018, the disclosure of which is hereby incorporated by reference in its entirety.

BACKGROUND

As technologies evolve, design and manufacturing of semiconductor devices become more complicated in view of smaller dimensions, increased functionality and more complicated circuitries. Numerous manufacturing operations are implemented within such small and high-performance semiconductor devices. Therefore, there is a continuous need to modify the structure and method of testing and manufacturing for the semiconductor devices in order to improve device robustness as well as reduce manufacturing cost and processing time.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
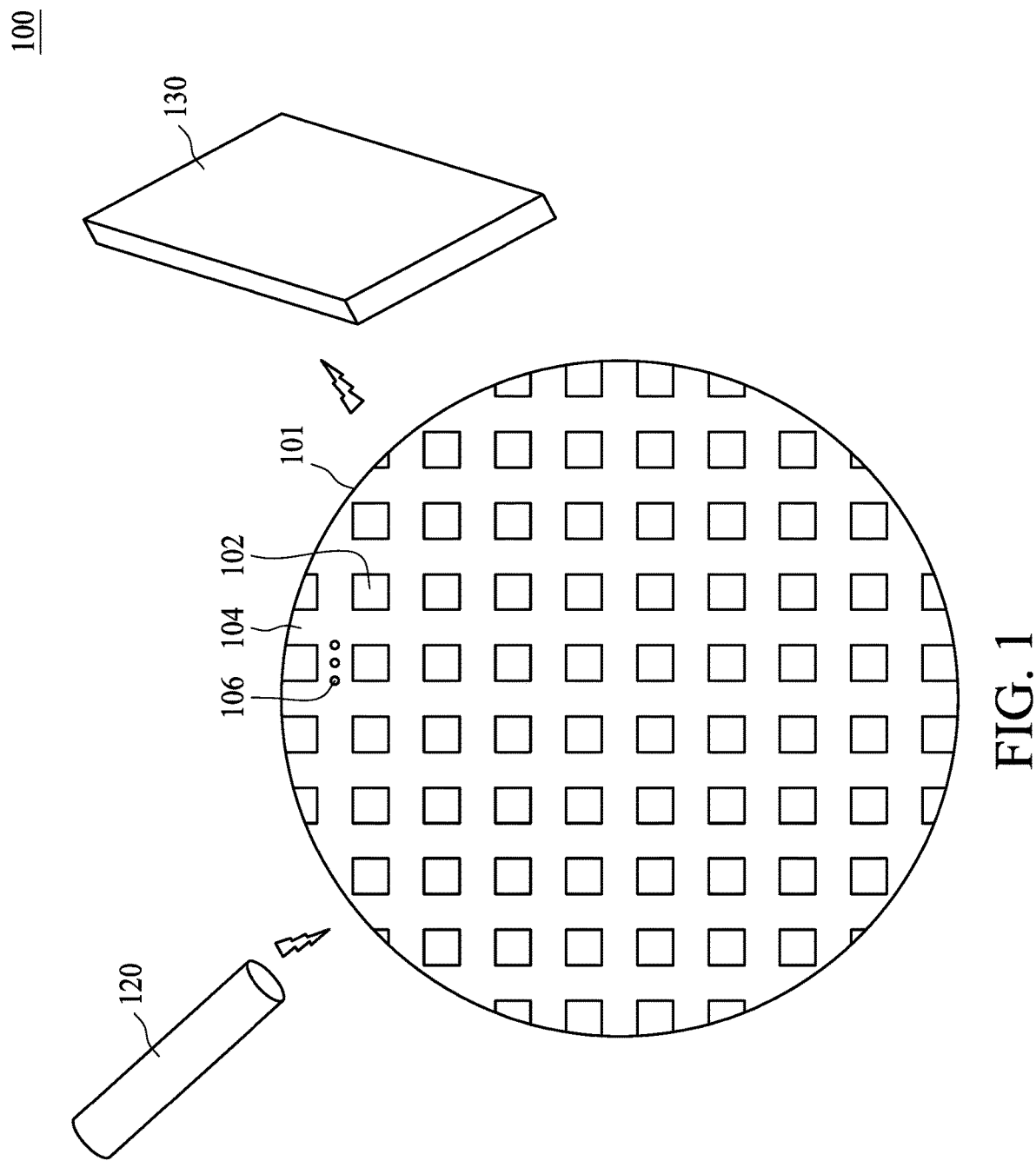
FIG. 1 is a schematic diagram showing a testing system, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The terms "couple," "coupled" and "coupling" used throughout the present disclosure describe the direct or indirect connections between two or more devices or elements. In some cases, a coupling between at least two devices or elements refers to mere electrical or conductive connections between them and intervening features may be present between the coupled devices and elements. In some other cases, a coupling between at least two devices or elements may involve physical contact and/or electrical connections.

The present disclosure relates generally to the field of semiconductor devices, and relates more particularly to the design of test structures on semiconductor wafers and the associated wafer-level testing methods for the purpose of manufacturing of semiconductor devices before they are separated into individual dies or chips.

When a semiconductor wafer is fabricated, the wafer contains an array of chips. When these chips are completed or at intermediate stages of the fabrication process, the wafer or the chips need to be tested for ensuring that the fabrication processes conform to the design specification. For example, a typical testing method is called a wafer acceptance testing (WAT) method, which is used to monitor the fabrication process deviations through testing some dummy features. The WAT method may provide several test patterns in a scribe line. Various test patterns may be selected and used for different testing subjects, such as a resistance or a current in a transistor. When circuit defects are detected in the test patterns during early stages of the fabrication process using the WAT method, it is indicated that the features of the chips may have defects similar to the defective test patterns. The wafer may be subjected to further inspection or examination, or may be discarded from the production line to save the fabrication cost and time.

In order to improve the effectiveness of the fault analysis in the wafer fabrication, it is required to detect not only the occurrence of the defect but also the location of the defective test pattern. Existing wafer-level testing involves inspecting the test pattern using an electro-beam (E-beam) or optical inspection equipment. However, the scanning process is rather time-consuming because a high image resolution is needed for inspecting the layouts and geometries of circuit features. Further, existing WAT measurement equipment only indicates the identity of the failed test pattern. More assessment measures are required, e.g., assessment based on thermal sensing images of the layouts, to locate the failed part in the test pattern. Additionally, limited information on the electrical property, such as whether a circuit is erroneously shorted or open, can be directly reflected by the image itself. As a result, the effectiveness of the WAT method is not satisfactory.

The present disclosure discusses an improved test pattern structure and its associated testing method for facilitating locating the failed part of the test pattern. One end of the test pattern is grounded before the testing is conducted. An E-beam is used as a scanning source for scanning the test pattern with a voltage contrast (VC) mode. A test image is obtained during the scanning process. The image thus obtained for the proposed test pattern provides a high contrast ratio between the electrically disconnected and connected features, thereby enabling efficient detection of the failed test pattern and locating of failed parts of the failed test pattern. The scanning time can be reduced significantly and the detection performance is enhanced accordingly.

FIG. 1 is a schematic diagram showing a testing system 100, in accordance with some embodiments. A semiconductor wafer 101 is provided, and includes several semiconductor devices 102 arranged in a matrix. The semiconductor wafer 101 may be held by a wafer holder or a chuck. The semiconductor wafer 101 includes a semiconductor material, such as silicon. In an embodiment, the semiconductor wafer 101 may include other semiconductor materials, such as silicon germanium, silicon carbide, gallium arsenide, or the like. The semiconductor wafer 101 may be a p-type semiconductor substrate (acceptor type) or an n-type semiconductor substrate (donor type).

Each of the semiconductor devices 102 may include various functional components, for example, transistors, diodes, capacitors or conductive interconnects, formed on a surface of the semiconductor wafer 101. The semiconductor devices 102 shown in FIG. 1 may include completed or incomplete semiconductor circuits. A scribe line area 104 is defined between adjacent semiconductor devices 102. The scribe line area 104 includes scribe lines arranged as intersecting columns and rows on the semiconductor wafer 101. After the fabrication and testing processes for the semiconductor devices 102 are completed, the semiconductor devices 102 are singulated into individual dies through the scribe line area 104.

In an embodiment, an exemplary test pattern 106 is formed on the semiconductor wafer 101 in the scribe line area 104. In an embodiment, the test pattern 106 is formed as a stand-alone circuit and is physically and electrically separate from the semiconductor devices 102. The design parameters of the test pattern 106 may be determined as reflecting the geometrical fidelity and electrical performance of the semiconductor devices 102 fabricated on the semiconductor wafer 101. In an embodiment, the shapes and geometries of the test pattern 106 are determined to conform to the design rules for fabricating the semiconductor devices 102 on the semiconductor wafer 101.

In an embodiment, during the semiconductor fabrication process, every processing step is performed across the semiconductor wafer 101 so that the testing pattern 106, which is made by the same processes as those for fabricating the semiconductor devices 102, are also formed in the scribe line 104. Because the fabrication instructions and environments for the semiconductor device 102 and the test pattern 106 are nearly the same, a defect found in the test pattern 106 is likely to be found in the semiconductor devices 102. As a result, the test pattern 106 is suitable for serving as an indicator of the fabricating process condition before a thorough testing is conducted.

In the present embodiment, the testing system 100 includes an energy source 120 and an imaging device 130 disposed adjacent to the wafer 101. The energy source 120 may be configured to emit electronic or optical beams on the semiconductor wafer 101, and the imaging device 130 is configured to capture and generate an image of the semiconductor wafer 101 irradiated by the emitted beams. The image may exhibit feature profiles of the test pattern 106 with different gray shades. A defect inspection may be conducted to perform a cursory check of the gray-shade image and determine if any circuit defect is found in the test pattern 106. In an embodiment, several test sites in different locations of the semiconductor wafer 101 are selected and subjected to the testing. The inspection process may be performed in a machine-aided manner, manually, or combinations thereof.

In an embodiment, the energy source 120 is configured to perform scanning by projecting an electron beam (E-beam) on an upper surface of the semiconductor wafer 101, and the imaging device 130 is configured to capture and generate an image based on the amount of secondary electrons emitted from the features of the test pattern 106. The imaging principle can be different according to various landing energies of the E-beam. For example, two imaging modes are utilized for identifying circuit defects, i.e., the voltage-contrast (VC) mode and the physical mode. The E-beam may have a power level between about 300 eV and about 600 eV for the scanning under the voltage-contrast (VC) mode and a power level higher than 1000 eV (e.g., between 1500 eV and 2000 eV) under the physical mode. In an embodiment, the scanning is performed to cover one scanning block at a time. Thus, the size of the scanning block is determined according to the resolution requirement. Conventional scanning operations under the physical mode involve a visual inspection (or physical mode) of detailed circuit profiles of the test pattern 106; however, the physical mode can allow the engineer to inspect only a small scanning block at one time, and is therefore very time-consuming. Moreover, existing scanning operations under the VC mode is not applicable in most test patterns because no sufficient free electrons are available. In the present embodiment, the scanning operation generates a VC image of the circuit. The generation of the VC image is achieved by grounding at least one conductive trace in the test pattern 106 at one end of the conductive trace, thereby providing a source of free electrons from the ground. Therefore, the VC image reveals the features in the test pattern 106 with a bright shade or a dark shade based on amounts of electrons received from the features of the test pattern 106 (i.e., the VC mode). The image obtained using the VC mode can provide the feature profile with a higher contrast ratio than that in the physical mode image, and the bright or dark shades correspond to the circuit conditions of conducting or open. Therefore, through the grounding arrangement of the test pattern 106, the VC mode is suitable for detection of circuit defects in a faster and easier way.

Figure 2A:
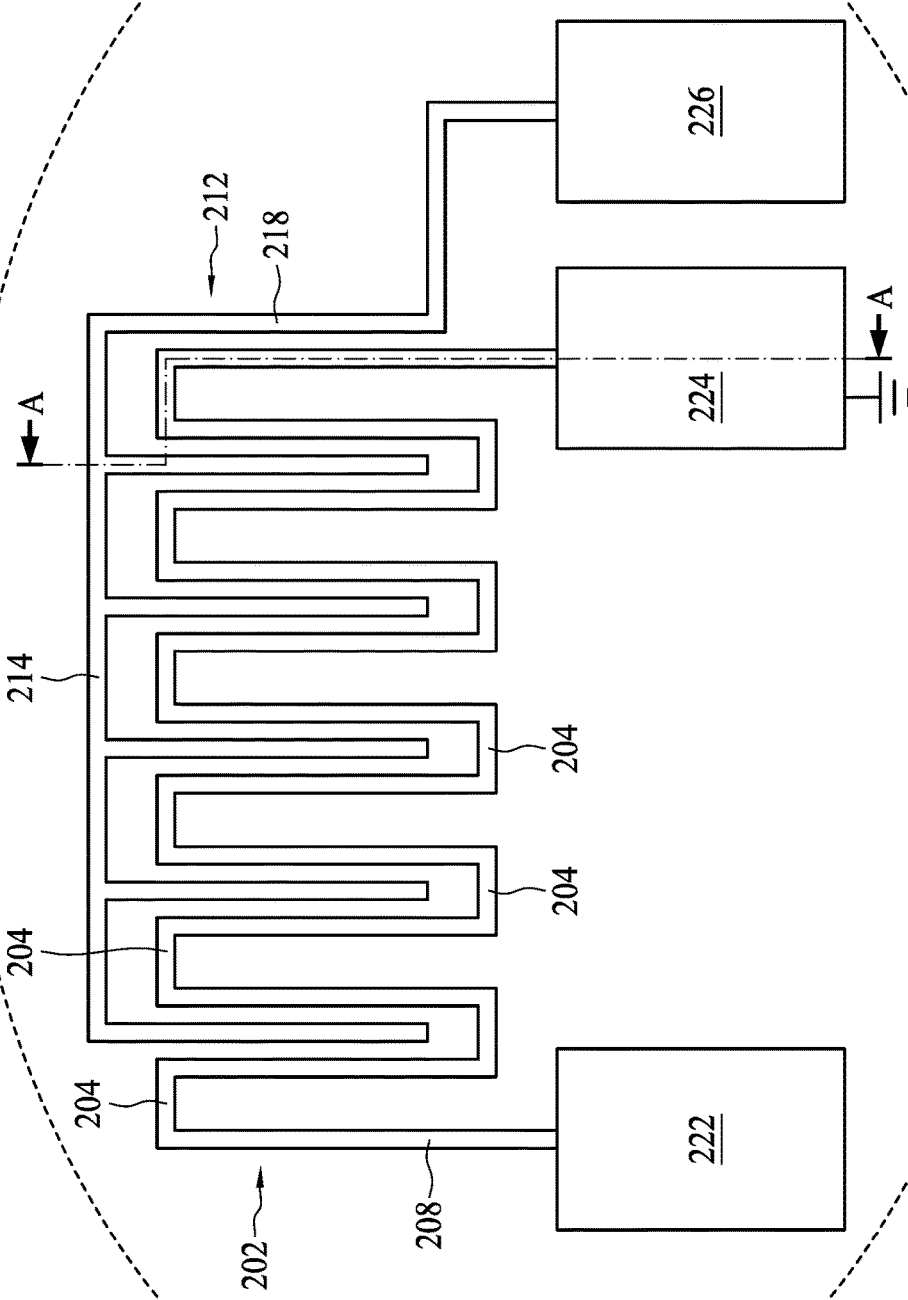
FIG. 2A is a schematic diagram showing an enlarged view of a test pattern in FIG. 1, in accordance with some embodiments.
Figure 2B:
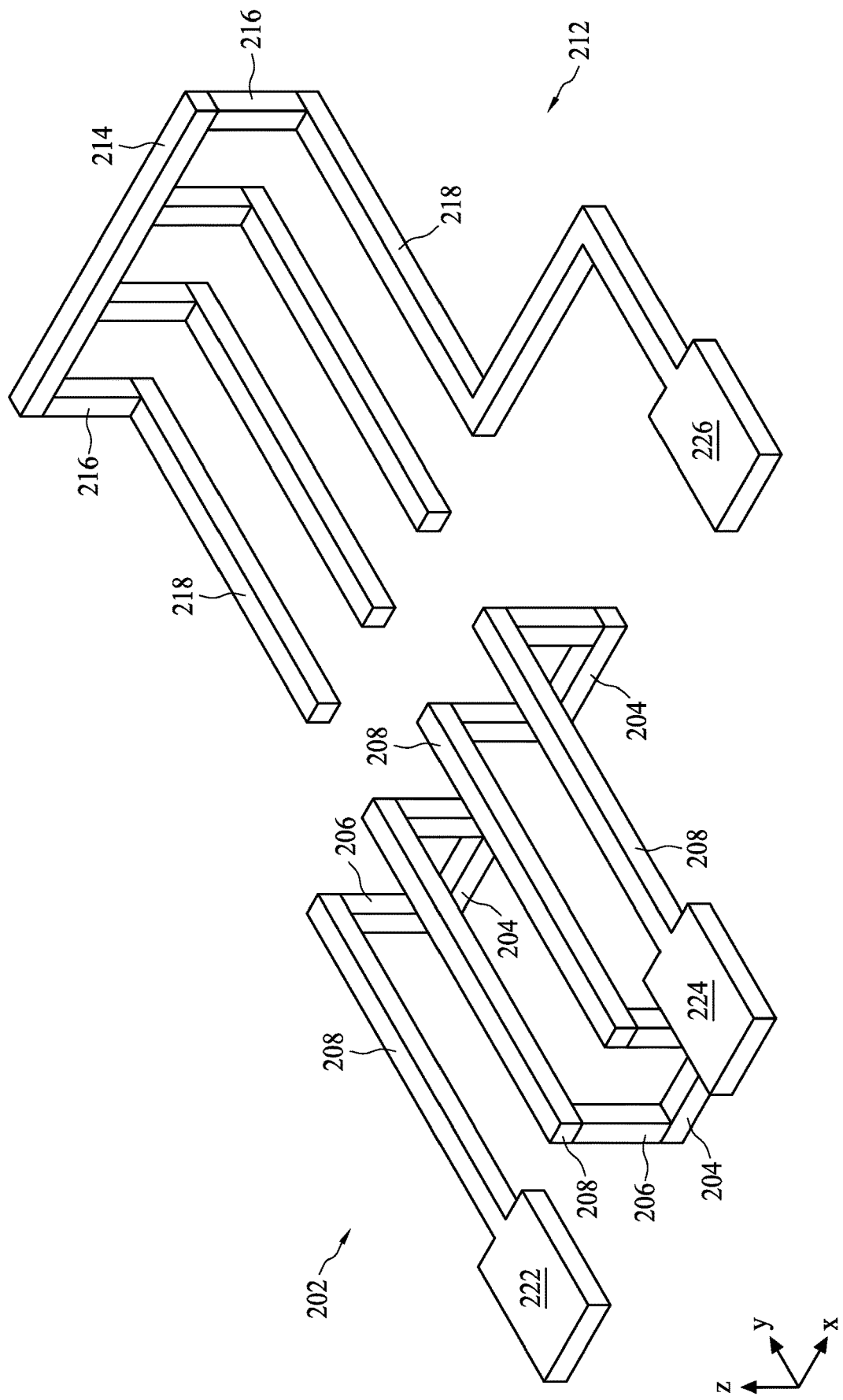
FIG. 2B is a perspective diagram of the test pattern shown in FIG. 2A, in accordance with some embodiments.

FIG. 2A is a schematic diagram showing an enlarged view of the test pattern 106, in accordance with some embodiments. FIG. 2B is a perspective diagram of the test pattern 106 in FIG. 2A. The test pattern 106 includes a first conductive trace 202 and a second conductive trace 212. In an embodiment, the layout of the conductive traces 202 and 212, such as their line widths and line spacing, are determined based on the design rules for the semiconductor devices 102. The first conductive trace 202 includes segments 204, 206 and 208 formed in different tiers. The segments 204 extend in a first axis, i.e., x-axis, and are formed in a lower (first) tier. The segments 208 are parallel strips or fingers that are spaced apart from each other in an upper (third) tier and extend along a second axis, i.e., the y-axis. Referring to FIG. 2A and FIG. 2B, the segments 206 are formed as conductive vias extending along a third axis, i.e., z-axis, in a middle (second) tier between the first and third tiers. The segments 204 and 208 extending horizontally, i.e., in the x-y plane, are connected through the vertically extending segments 206. Similarly, the second conductive trace 212 includes segments 214, 216 and 218 formed in different tiers. The segments 218 are parallel strips or fingers that are spaced apart from each other in the third tier of the fingers 208 in the first conductive trace 202 and extend along the second axis, i.e., the y-axis. The segment 214 extends in the first axis, i.e., the x-axis, and is formed in a top (fifth) tier. The segments 216 are formed as conductive vias extending along the z-axis in a middle (fourth) tier between the third and fifth tiers. The segments 214 and 218 extend horizontally, i.e., in the x-y plane, and are connected through the vertically extending segments 216.

Two conductive pads 222 and 224 are disposed on two ends of the first conductive trace 202. A conductive pad 226 is disposed on one end of the second conductive trace 212. In an embodiment, the conductive pads 222, 224 and 226 are formed as test pads and configured to receive a test probe. During a testing process, probe pins transmitting test signals with predetermined signal voltages or waveforms are engaged with the test pads 222, 224 and 226. In some embodiments, test measurements of voltage or current values are taken through the conductive pads 222, 224 and 226. In some embodiments, the conductive pads 222, 224 and 226 have a pad width greater than the line width of the segments of the respective conductive traces 202 and 212 for improving the accuracy and convenience of test measurements.

Referring to FIG. 2A, one conductive pad of the first conductive trace 202, e.g., the conductive pad 224, is grounded. The other conductive pad, e.g., the conductive pad 222, is floated. The arrangement of grounding one conductive pad (pad 224) while floating the other conductive pad (pad 222) of the conductive trace 202 can help generation of a circuit image using the VC mode of the energy source 120, i.e., the VC scanning image. In an embodiment, a conductive pad 226 is disposed at one end of the second conductive trace 212. The arrangement of the grounded conductive pads 222, 224 and 226 can be used in the proposed VC scanning method as well as the method using the test probe device, e.g., a circuit probe (CP) test.

FIG. 2A and FIG. 2B are shown to illustrate the structures of the first conductive trace 202 and second conductive trace 212 according to some embodiments. However, other embodiments may be also possible. In one example, more conductive pads may be formed in different tiers and electrically connect to the conductive pads 222, 224 or 226, as can be seen in FIG. 3K described in subsequent paragraphs.

Figure 3A:
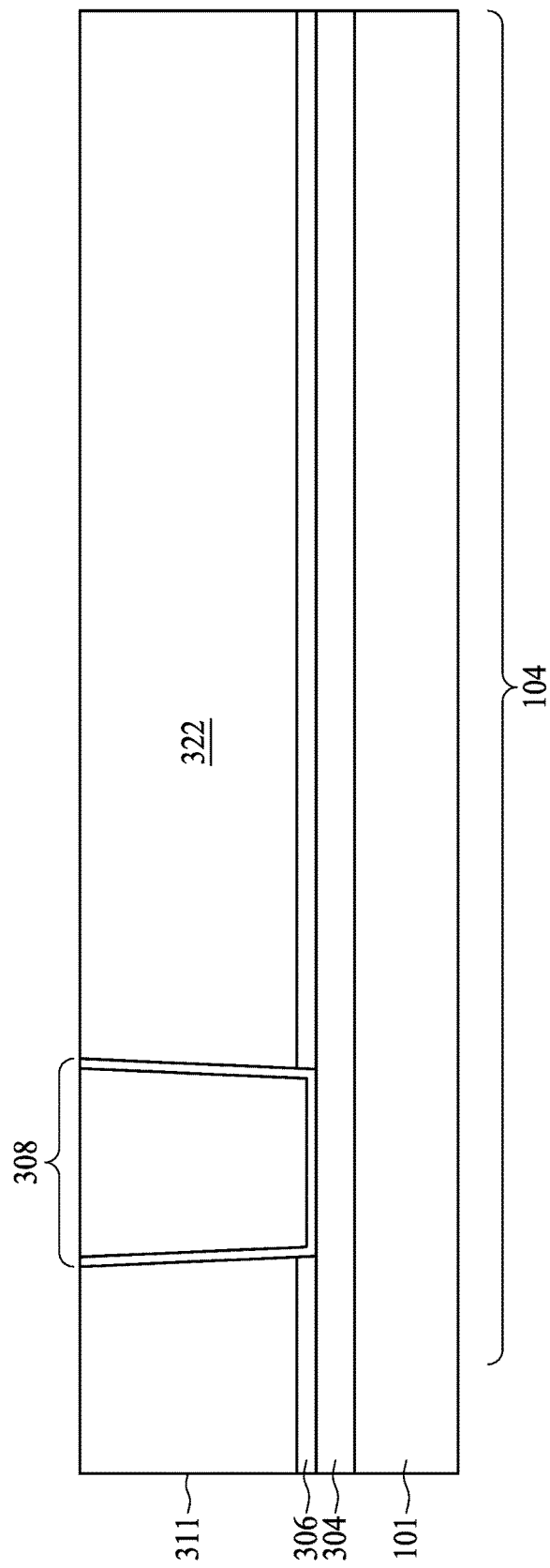
FIG. 3A through FIG. 3J are schematic cross-sectional diagrams showing intermediate stages of fabricating and testing the semiconductor wafer shown in FIG. 1, in accordance with some embodiments.

FIG. 3A through FIG. 3J are schematic cross-sectional diagrams showing intermediate stages of fabricating and testing the semiconductor wafer 101 in FIG. 1, in accordance with some embodiments. FIG. 3K is a perspective diagram of the finalized test pattern 106 based on the manufactured operations in FIGS. 3A to 3J, in accordance with some embodiments. FIG. 3K is similar to FIG. 2B except for more conductive pads in FIG. 3K are illustrated. For clarity, FIGS. 3A to 3J illustrate enlarged views of the scribe line area 104 of the semiconductor wafer 101 and omit semiconductor devices 102 adjacent to the test pattern 106. The cross-sectional views are taken along cross-sectional lines AA of the test pattern 106 in FIG. 2A. Referring to FIG. 3A, the semiconductor wafer 101 is provided or received. In some embodiments, at least a portion or some layers of the semiconductor devices 102 are formed before the test pattern 106 is formed.

During or after the formation of the semiconductor devices 102, in some embodiments a conductive layer 304 is formed in the scribe line area 104 in the semiconductor wafer 101. The conductive layer 304 may extend across the areas of the semiconductor devices 102 and the scribe line area 104. In an embodiment, the conductive layer 304 extends in the scribe line area 104 only and is absent from the semiconductor devices 102. In an embodiment, the conductive layer 304 is electrically isolated from the semiconductor devices 102 of the semiconductor wafer 101. In an embodiment, the conductive layer 304 is a ground layer. The conductive layer 304 may be formed of polysilicon or metallic materials, such as tungsten, copper, silver, gold, titanium, or the like. The conductive layer 304 may be formed by a deposition operation, such as chemical vapor deposition (CVD), physical vapor deposition (PVD), atomic layer deposition (ALD) or the like. An insulating layer 306 may be formed over the conductive layer 304. The insulating layer 306 may include a dielectric material, such as oxide, nitride, oxynitride, or the like. The insulating layer 306 may be formed by a deposition method or other suitable operations. In an embodiment, the conductive layer 304 or the insulating layer 306 is omitted from the semiconductor wafer 101 (see FIG. 3J). Under such condition, the semiconductor wafer 101 itself serves as the ground layer configured to ground the overlying conductive pads without the need of the conductive layer 304.

A interconnect structure comprised of stacked tiers is formed over the conductive layer 304 and the insulating layer 306. An exemplary operation of forming the interconnect structure begins by patterning the insulating layer 306 to expose a portion of the conductive layer 304. A base tier 311 of the interconnect structure is formed over the insulating layer 306. The base tier 311 includes a conductive via 308 and a dielectric layer 322 surrounding the conductive via 308. The conductive via 308 is configured to electrically couple the conductive layer 304 with overlying features. An exemplary method of forming the base tier 311 may include depositing a dielectric material of the dielectric layer 322 over the insulating layer 306 and patterning the dielectric material. A via hole is formed in the dielectric layer 322 accordingly. One or more conductive materials, e.g., tungsten, copper, titanium or combinations thereof, are electroplated or deposited over the dielectric layer 322 or within the via hole for forming the conductive via 308. In some embodiments, a planarization operation is performed to level top surfaces of the conductive via 308 with the dielectric layer 322 and remove excess conductive materials over the dielectric layer 322. In embodiments where the conductive layer 304 or the insulating layer 306 is absent, the conductive via 308 is formed directly on the substrate of the semiconductor wafer 101 (see FIG. 3J).

Figure 3B:
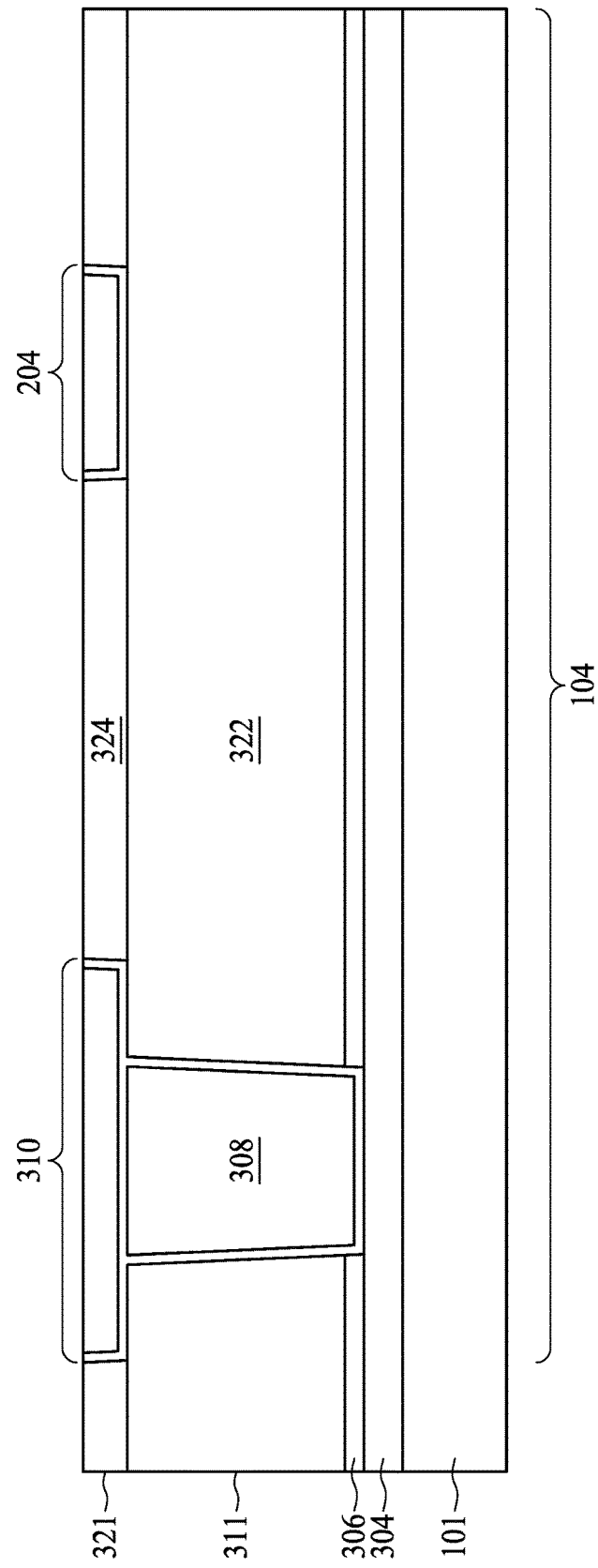
Figure 3C:
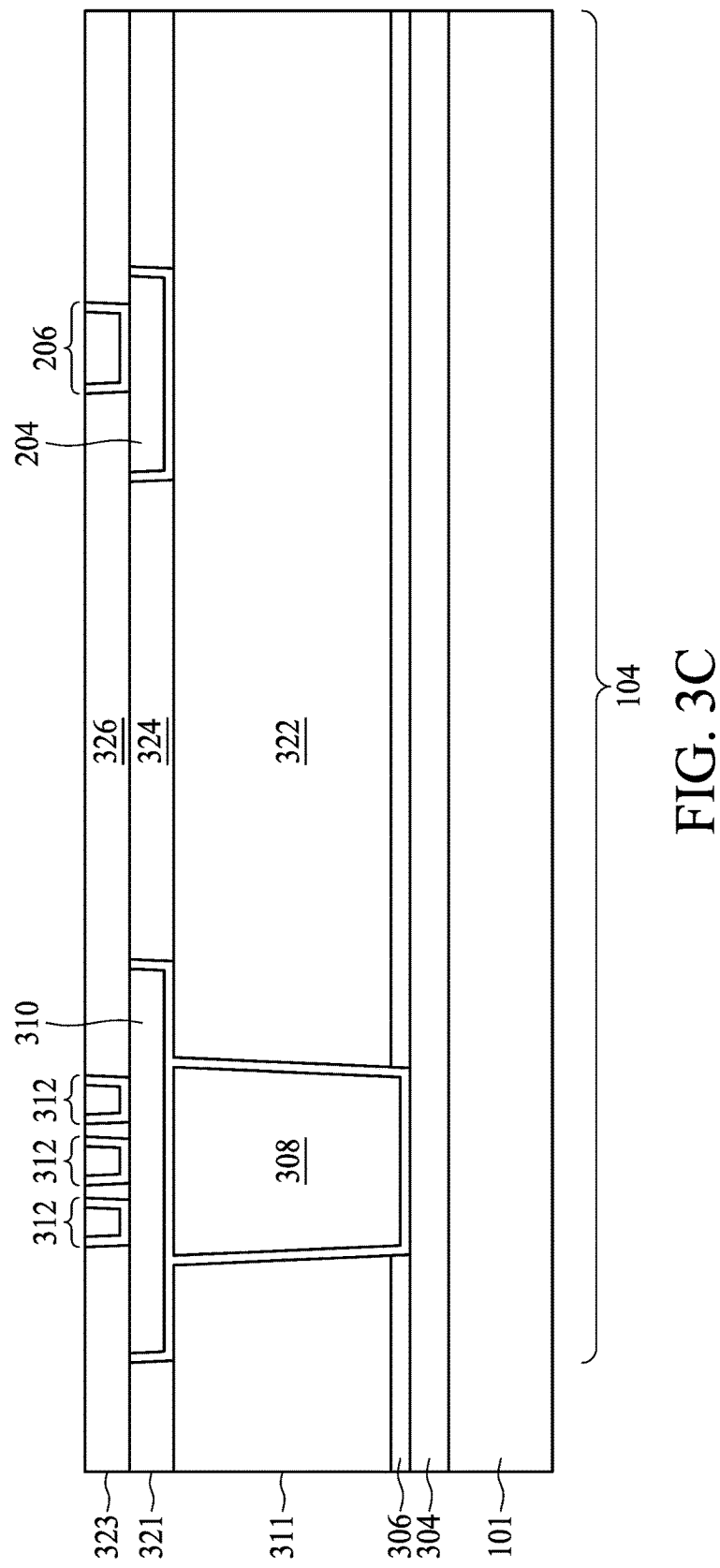

Referring to FIG. 3B, a first tier 321 is formed over the base tier 311. The first tier 321 includes the segments 204 of the conductive trace 202 and a conductive pad 310 adjacent to the segments 204. The conductive pad 310 is electrically coupled to the conductive via 308. The material, configuration and forming method of the segments 204 and the conductive pad 310 are similar to those of the conductive via 308. Subsequently, a second tier 323 is formed over the first tier 321, as shown in FIG. 3C. The second tier 323 includes the segments 206 of the conductive trace 202 and a conductive via 312 adjacent to the segments 206. The conductive via 312 is electrically coupled to the conductive pad 310. The material, configuration and forming method of the segments 206 and the conductive via 312 are similar to those of the conductive via 308. In an embodiment, a plurality of conductive vias 312 are formed to electrically couple to the conductive pad 310. In an embodiment, the conductive vias 312 are arranged in an array when viewed from above.

Figure 3D:
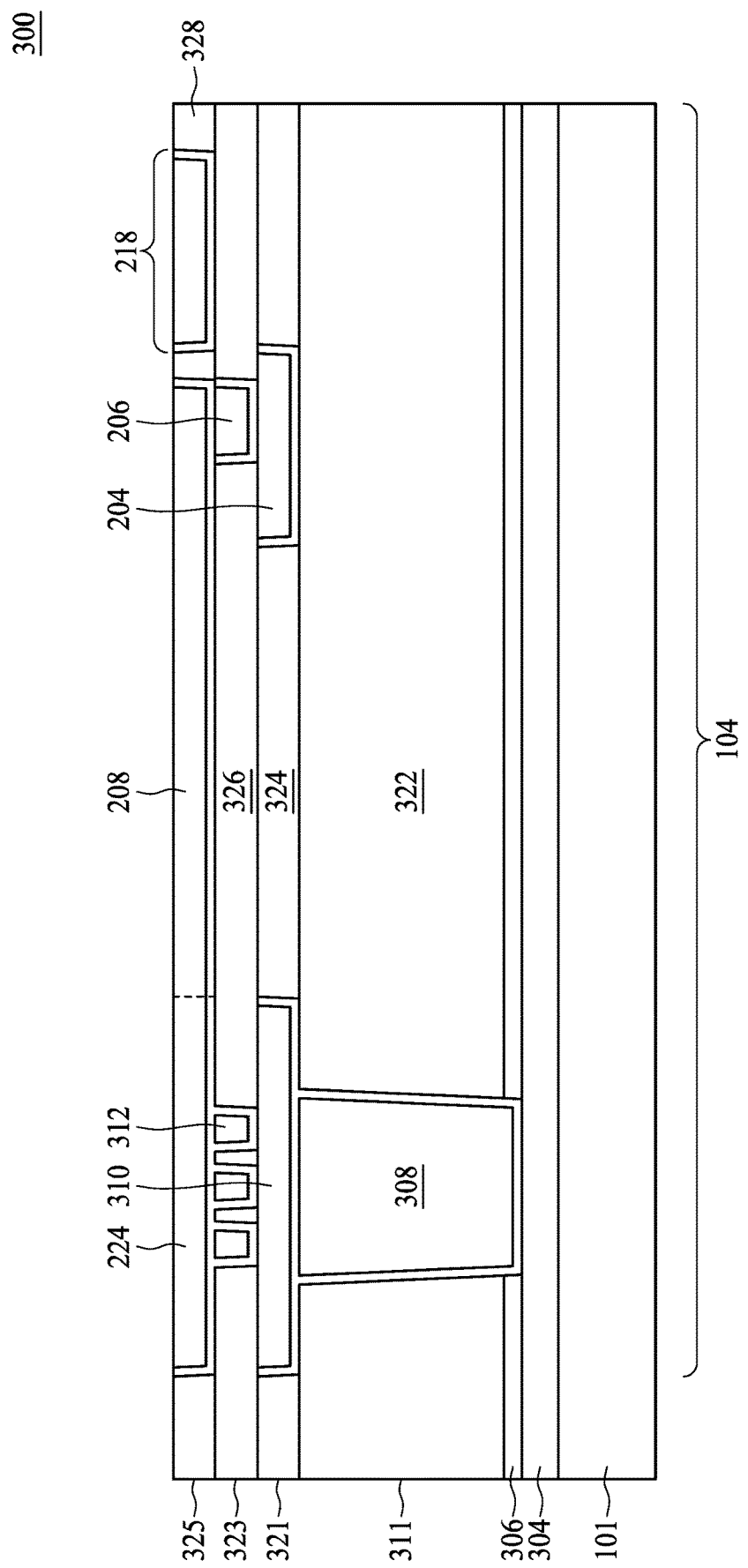

Referring FIG. 3D, a third tier 325 is formed over the second tier 323. The third tier 325 includes the fingers 208, the conductive pad 224 of the conductive trace 202, and the fingers 218 of the second conductive trace 212. In addition, the conductive pads 222 and 226 of the first conductive trace 202 and the second conductive trace 212, respectively, are also formed, but are not shown in FIG. 3D. The conductive pads 224 and 310 may have approximately equal shapes and areas. In an embodiment, the fingers 208 and 218 and the conductive pads 222, 224 and 226 are formed simultaneously. The conductive pad 224 is electrically coupled to the conductive via 312 and to the conductive layer 304. As a result, the conductive pad 224 is grounded through the conductive vias 308 and 312 and the conductive pad 310. The material, configuration and forming method of the fingers 208 and 218 and the conductive pads 222, 224 and 226 are similar to those of the conductive via 308. Upon completion of the third tier 325, the first conductive trace 202 is completed, i.e., the segments 204, 206 and 208 are connected to form a conduction path. The second conductive trace 212 is not yet completed at such time because each of the fingers 218 remains electrically isolated from each other.

Figure 3E:
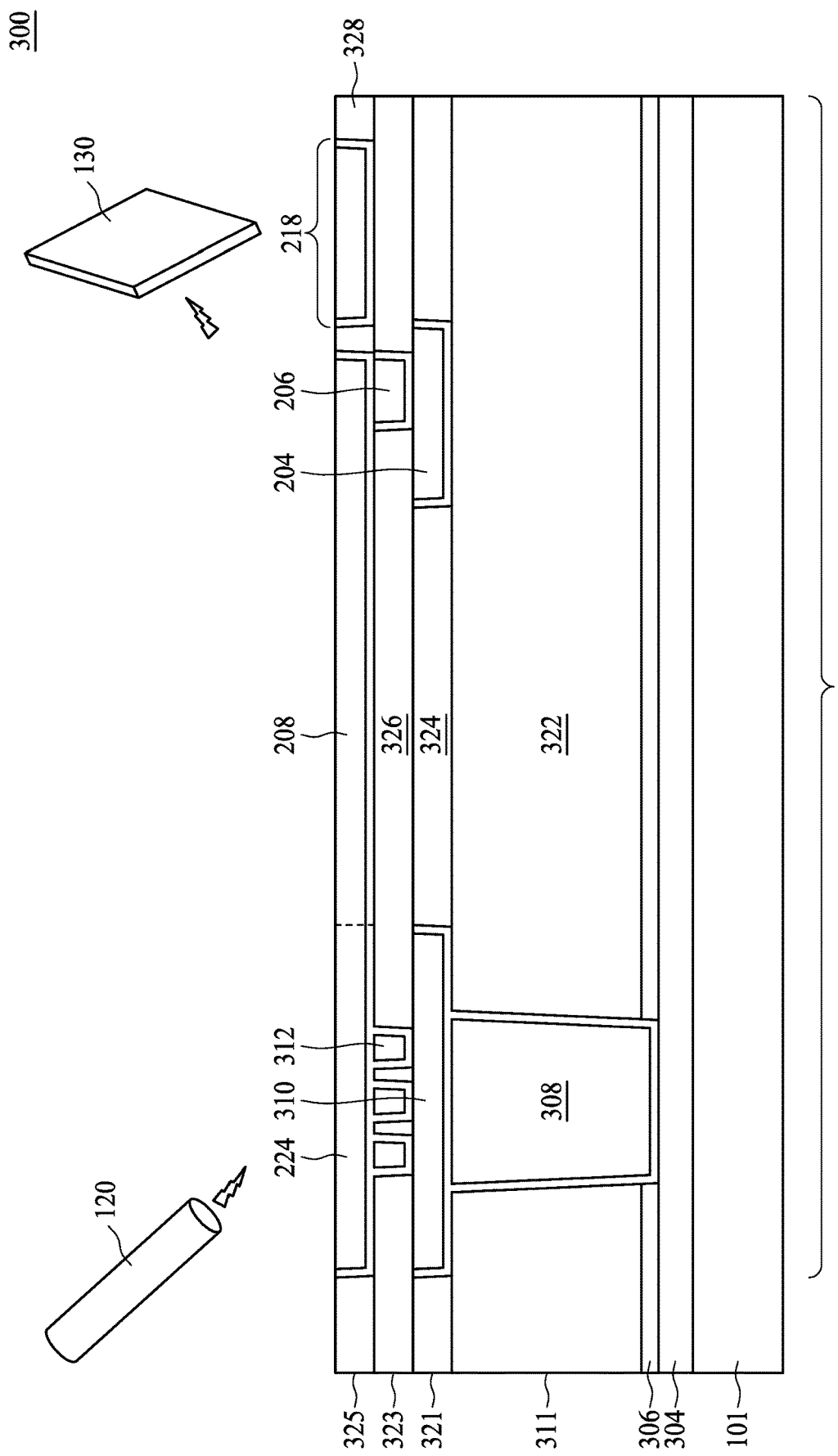

A first round of testing is performed on the test pattern 106, as illustrated in FIG. 3E. A scanning operation is performed on exposed surfaces of the first conductive trace 202 and the fingers 218 of the second conductive trace 212. The energy source 120 is configured to project an E-beam on the first trace 202, e.g., the parallel fingers 208 and the parallel fingers 218. A VC scanning image is obtained when the scanning is performed. As discussed previously, the scanning operation can be performed under either of two modes, i.e., the physical mode or the VC mode, depending on the application. However, the VC mode can be used to obtain the electrical properties of the test pattern 206, such as an open circuit or a short circuit, given that the test pattern 206 is supplied with sufficient free electrons. Because the conductive pad 224 is grounded to the conductive layer 304, the segments of the first conductive trace 202 that are electrically coupled to the conductive pad 224 are also grounded. Any portion of the first conductive trace 202 that is successfully formed, i.e., electrically coupled to the conductive layer 304, will exhibit a bright (light) shade in the VC scanning image resulting from the secondary free electrons emitted from the first conductive trace 202. In contrast, portions of the test pattern 106 free from free electrons or containing a limited amount of free electrons will exhibit a dark (heavy) shade in the image, because such portions are not able to emit many secondary free electrons onto the imaging device 130.

A machine-aided or manual inspection of the voltage-contrast image may be utilized to characterize the electrical properties of the test pattern 106 through examination of the distribution of bright and dark shades of the test pattern 106. Therefore, the VC scanning image can help detect the routing characteristics of the circuit by concentrating directly on the electrical properties of the test pattern 106, rather than indirect examination through the physical mode that determines the electrical properties of the test pattern 106 using the circuit geometrical properties (i.e., the circuit profile).

Figure 3F:
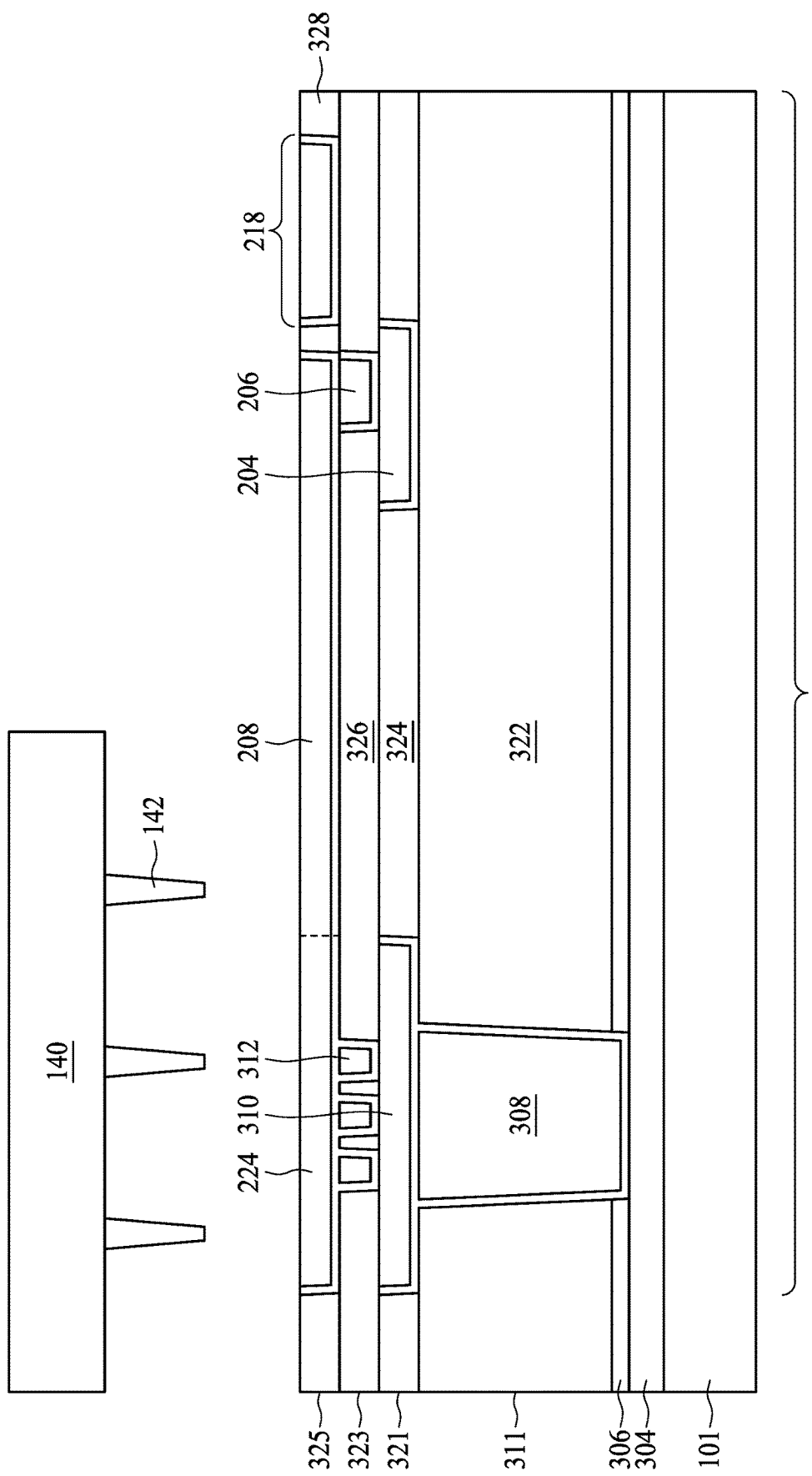

FIG. 3F illustrates a second round of testing on the test pattern 106 using a test probe device 140. The test probe device 140 includes a plurality of probe pins 142 to convey test signals to the test pattern 106. In an embodiment, the test probe device 140 is configured to perform a CP test by engaging the tips of the probe pins 142 with the test pads of the test pattern 106, such as the conductive pads 222 and/or 224. Various test signals with different voltage levels are applied to the conductive pads 222 and 224. A sensing module (not shown) of the test probe device 140 is configured to take measurements of the test pattern 106, such as the sheet resistance or contact resistance thereof. In the present embodiment, the conductive pads 222 and 224 can be shared by the VC scanning mode and the CP test, thereby reducing the number of the test pads required. In an embodiment, a pair of probe pins 142 are engaged with the conductive pads 222 and 224 for performing a CP test. During a CP test case, a high voltage and a low voltage are applied to the conductive pads 222 and 224, respectively. The conductive pad 224, which is grounded for use during the voltage-contrast mode test, corresponds to a low voltage signal input in the CP test in order to mitigate the measurement bias.

Figure 3G:
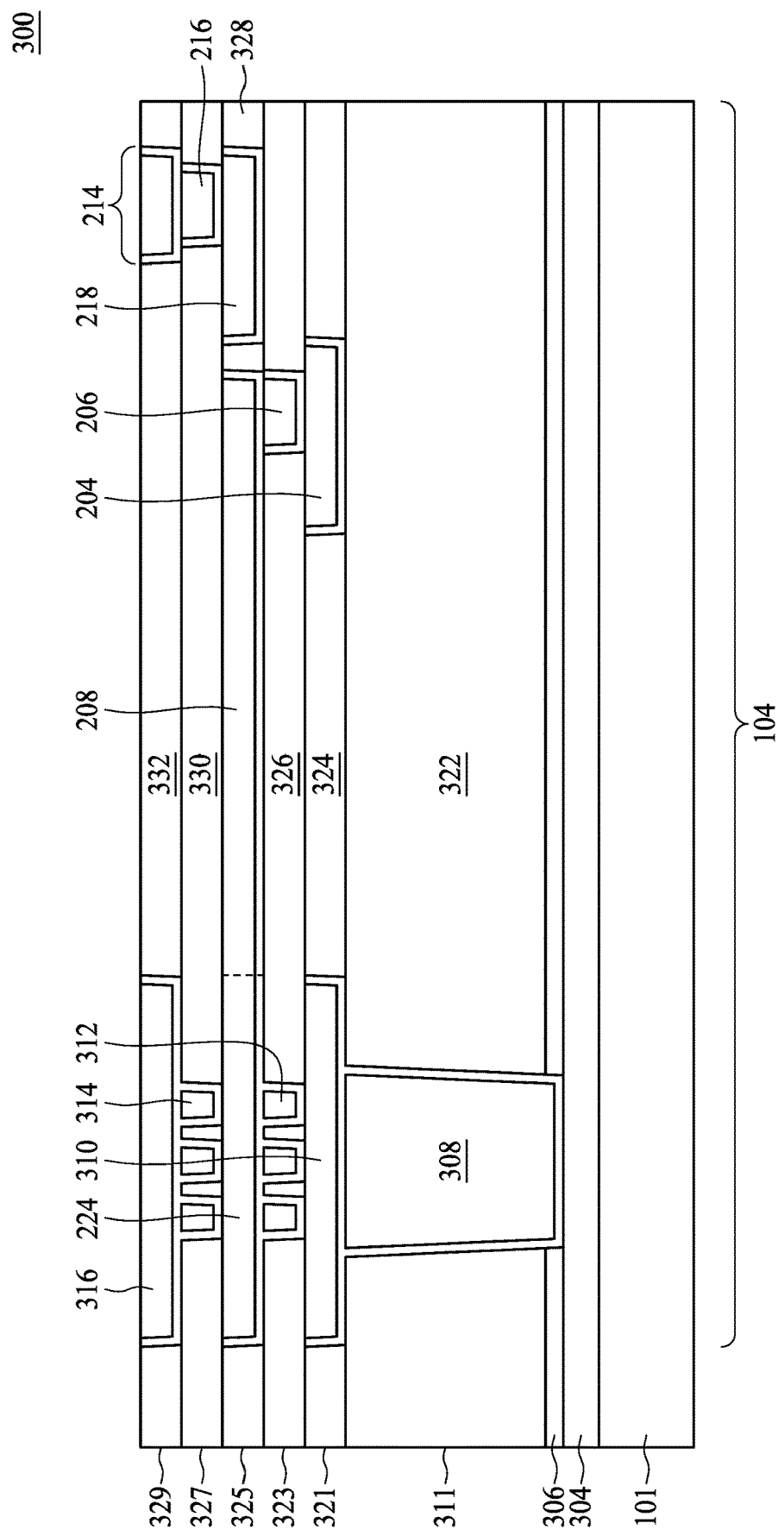

Referring to FIG. 3G, a fourth tier 327 and a fifth tier 329 are sequentially formed over the third tier 325. The fourth tier includes a conductive via 216 and a dielectric layer 330 surrounding the conductive via 216. The fifth tier 329 includes the segments 214 and a dielectric layer 332 surrounding the segments 214. The conductive via 216 in the fourth tier electrically couples the fingers 218 in the third tier to the segments 214 in the fifth tier.

In addition, the fourth tier 327 includes conductive vias 314 over the conductive pad 224. In an embodiment, the conductive vias 314 form an array when viewed from above. The conductive vias 314 are formed to electrically couple to the conductive pad 224. Also, the fifth tier 329 includes a conductive pad 316 electrically coupled to the conductive vias 314. As such, the conductive pad 316 serves as the extension of the conductive pad 224 so that the testing signal can be conveyed to the first conductive trace 202 through the conductive pad 316 when the first conductive trace 202 is covered by the fifth tier 329. The material, configuration and forming method of the segments 214, the conductive pad 316 and the conductive vias 216 and 314 are similar to those of the conductive via 308. Upon completion of the fourth tier 327 and the fifth tier 329, the second conductive trace 212 is completed, i.e., the segments 214 and 218 are connected to form a conduction path. The first and second rounds of testing as shown in FIGS. 3E and 3F are performed in an early stage before the completion of the second conductive trace 212, allowing such first and second rounds of testing to detect potential defects of the manufacturing processes as early as possible. The problematic wafers can be detected and discarded or subjected to further examination, thereby facilitating the fault analysis.

In an embodiment, referring to FIG. 3B, the first tier 321 further includes two conductive pads (not separately shown) corresponding to the conductive pads 222 and 226. Similarly, referring to FIG. 3C, the second tier 323 further includes conductive vias (not separately shown) electrically coupling the two underlying conductive pads to the corresponding conductive pads 222 and 226. In addition, referring to FIG. 3G, the fifth tier 329 further includes two conductive pads (not separately shown) corresponding to the conductive pads 222 and 226. Similarly, the fourth tier 327 further includes conductive vias (not separately shown) electrically coupling the two conductive pads to the conductive pads 222 and 226, respectively. The cascaded configurations and forming methods of the aforesaid conductive pads and conductive vias with respect to the conductive pad 222 or 226 are similar to those of the conductive pad 224, i.e., features constituted by the conductive pads 310, 224 and 316 and conductive vias 312 and 314.

Figure 3H:
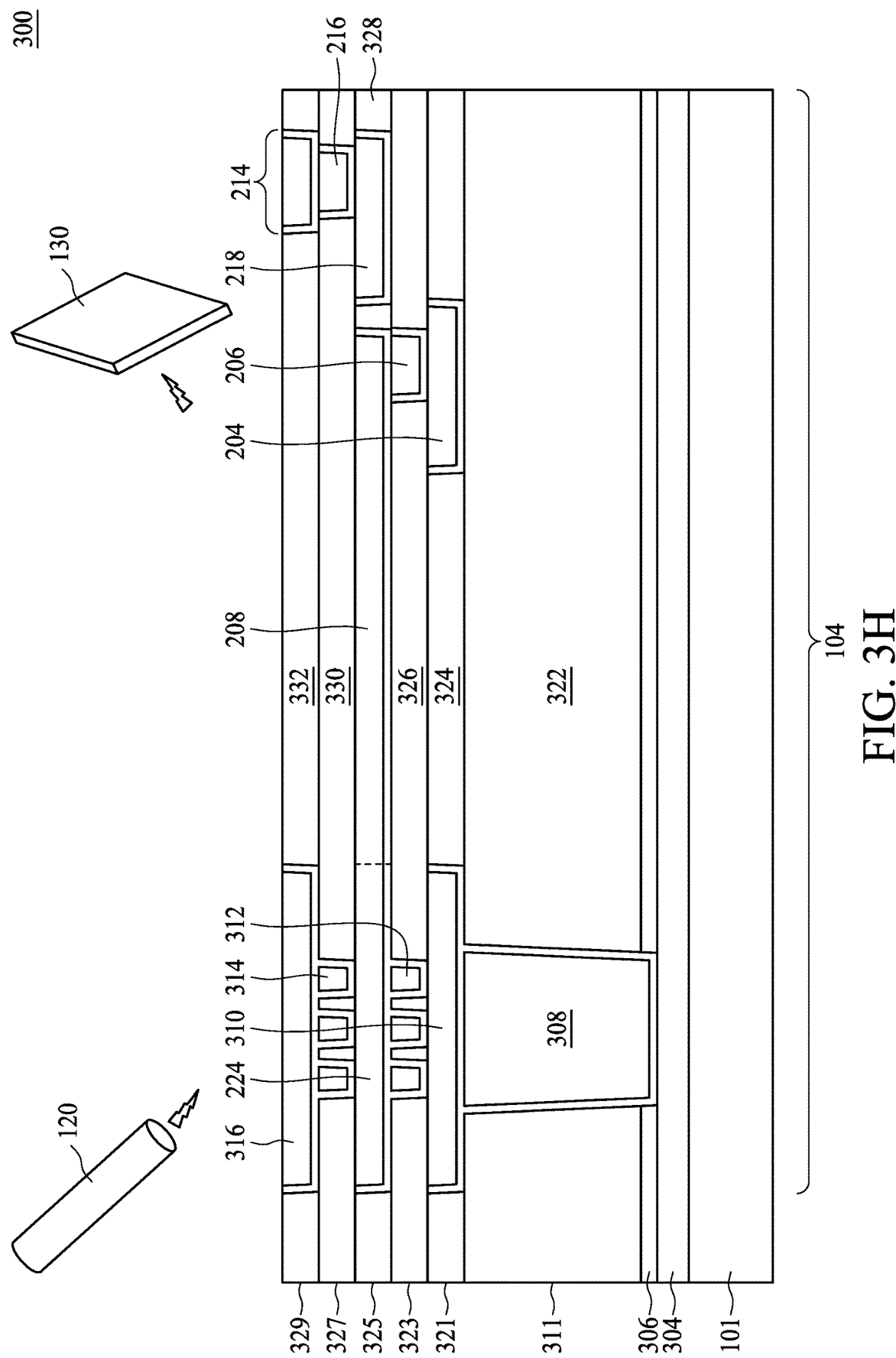
Figure 3I:
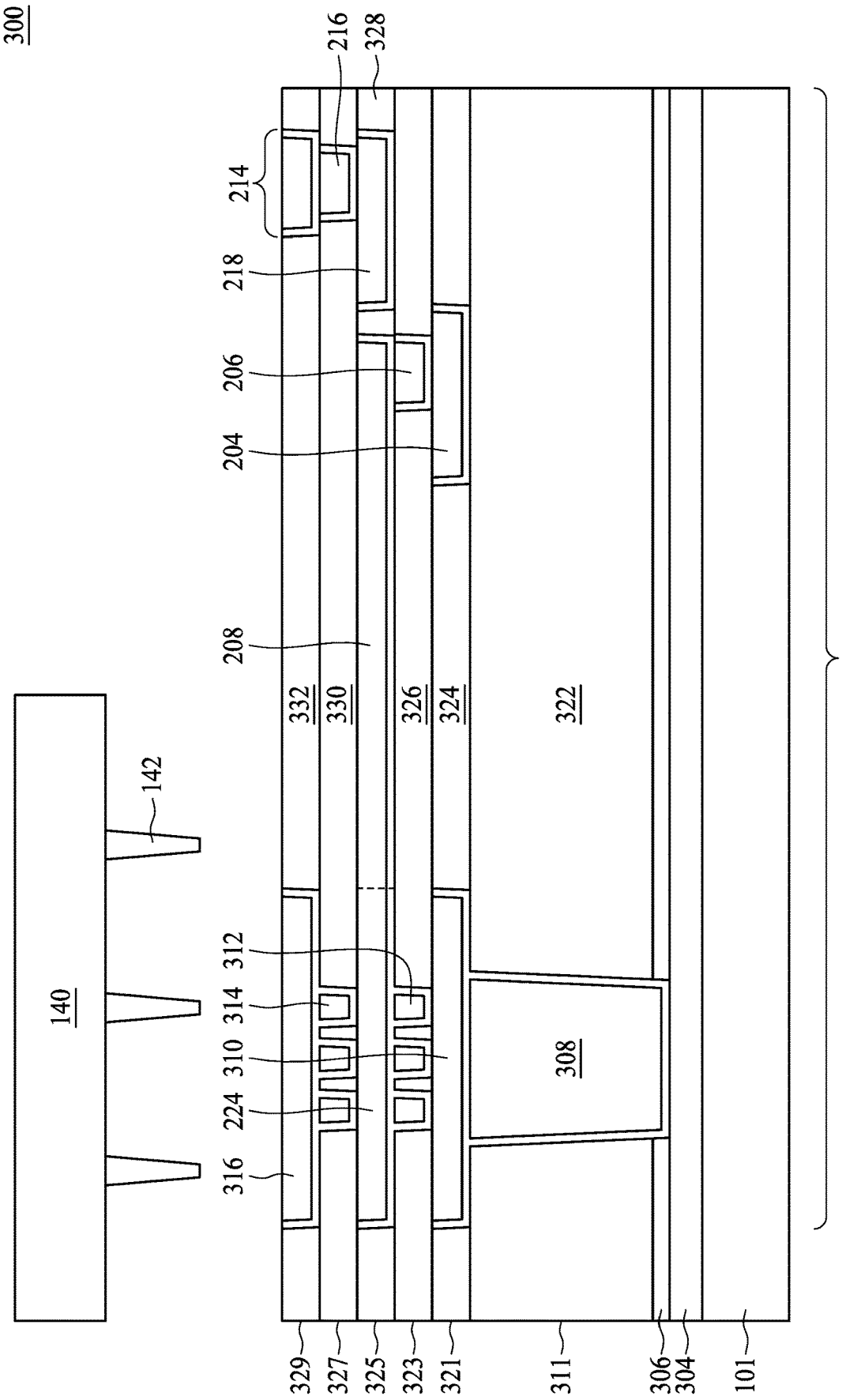

Referring to FIG. 3H, when the first conductive trace 202 and the second conductive trace 212 are completed, another round of VC scanning test may be performed. The VC scanning test may be similar to that illustrated in FIG. 3E. In an embodiment, referring to FIG. 3I, another round of the CP test may be performed subsequent to the VC scanning test. For example, a pair of probe pins conveying a high voltage and a low voltage, respectively, are applied to the conductive pads 222 and 226, respectively. In order to mitigate the measurement bias, the conductive pad 224, which is grounded for use in the VC scanning test, is not used as a high-voltage input during the CP test. In an embodiment, the order of FIGS. 3H and 3I can be changed. In an embodiment, the VC scanning test has been completed for the short circuit and open circuit in FIG. 3E before the fourth tier 327 is formed. In that situation, the VC scanning test in FIG. 3H may be omitted. In another embodiment, the first CP test in FIG. 3F, i.e., the CP test performed before the second conductive trace 218 is completely formed, may be omitted. The whole CP test may be conducted during the stage of FIG. 3I when the entire circuitry of the test pattern 106 is ready.

Figure 3J:
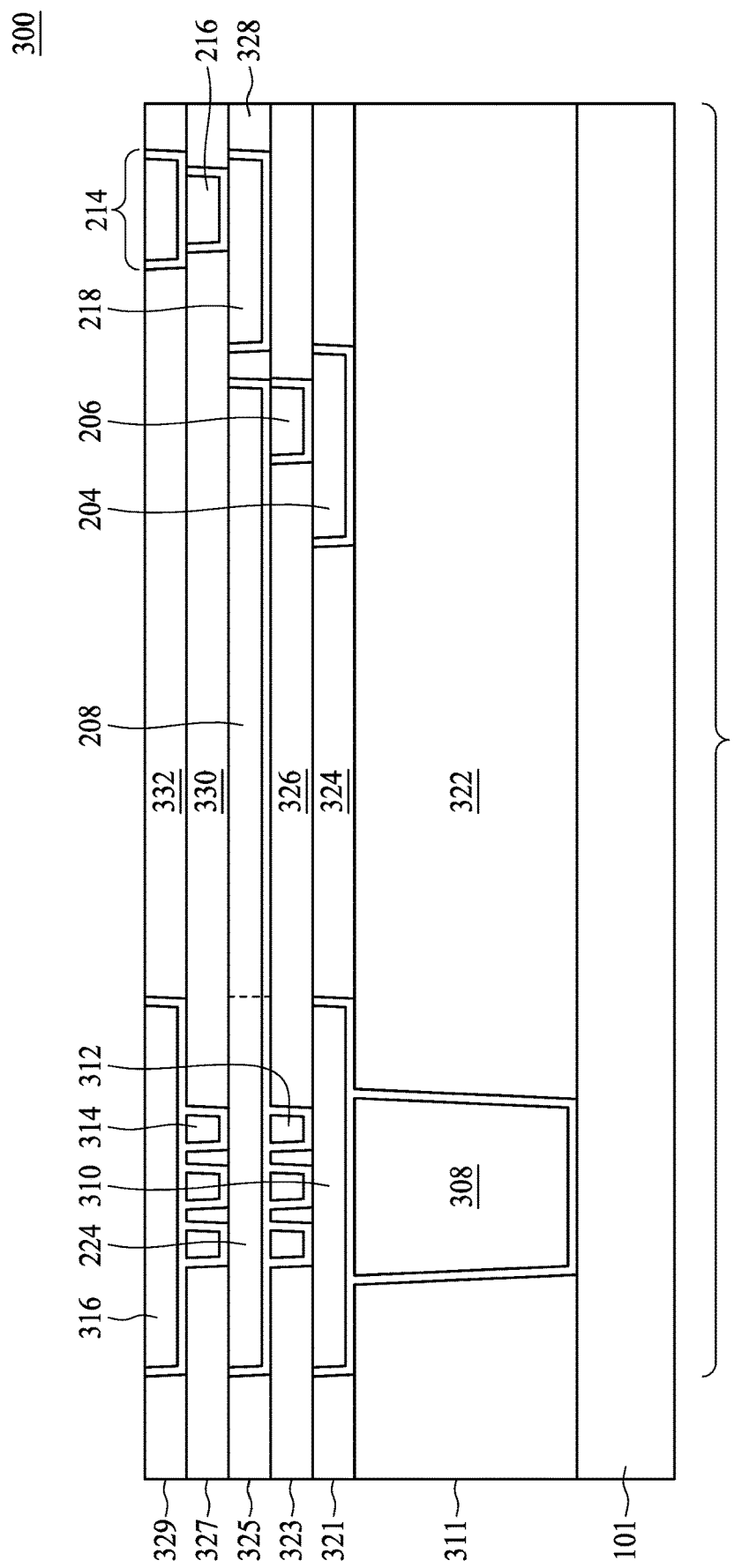
Figure 3K:
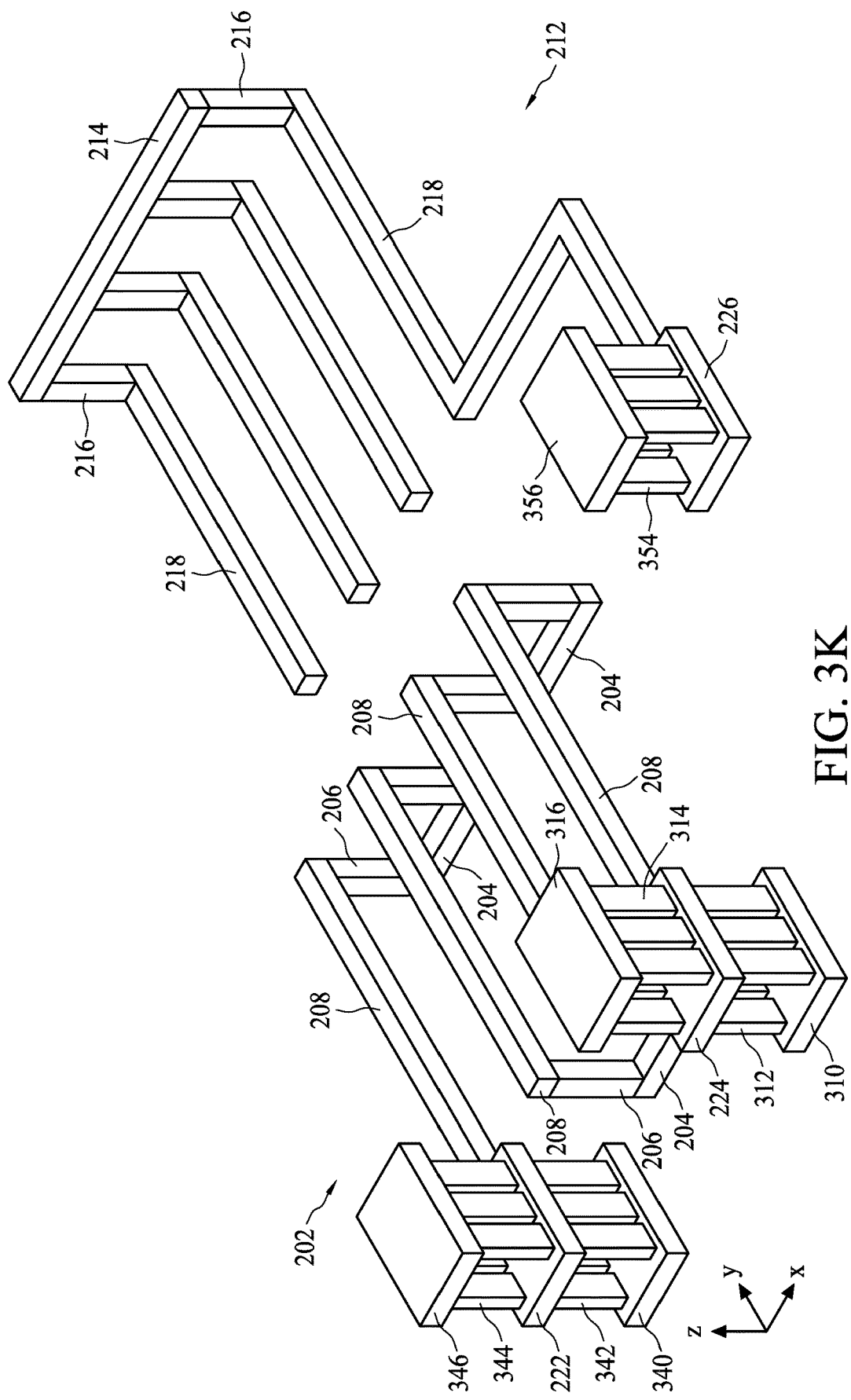
FIG. 3K is a perspective diagram of a test pattern based on the manufactured operations in FIGS. 3A to 3J, in accordance with some embodiments.

FIG. 3J illustrates the test pattern 106 in accordance with some embodiments. The test pattern 106 in FIG. 3J is similar to that in FIG. 3I except that the conductive via 308 extends to the substrate of the semiconductor wafer 101. The substrate of the semiconductor wafer 101 serves as the ground layer for the test pattern 106. In some embodiments, the conductive layer 304 and/or the insulating layer 306 may be omitted, as discussed previously.

FIG. 3K is a perspective diagram of the finalized test pattern 106 based on the manufactured operations FIGS. 3A to 3J, in accordance with some embodiments of the present disclosure. Referring to FIG. 3H and FIG. 3K, conductive pads 310 and 316, which are formed in the first tier 321 and fifth tier 329, respectively, are electrically coupled to the conductive pad 224 in the third tier 325 through conductive vias 312 and 314, respectively. Similarly, although not shown in the cross-sectional views of FIGS. 3A to 3J, conductive pads 340 and 346, which are formed in the first tier 321 and fifth tier 329, respectively, are electrically coupled to the conductive pad 222 in the third tier 325 through conductive vias 342 and 344, respectively. Moreover, a conductive pad 356 is formed in the fifth tier 329 and is electrically coupled to the conductive pad 226 in the third tier 325 through conductive vias 354. Each set of the conductive vias 312, 314, 322, 324 and 354 are formed in arrays of polygonal pillars, as shown in the embodiment of FIG. 3K. However, other configurations and numbers of these vias can be different depending on design requirement and are still within the contemplated scope of the present disclosure.

Figure 4A:
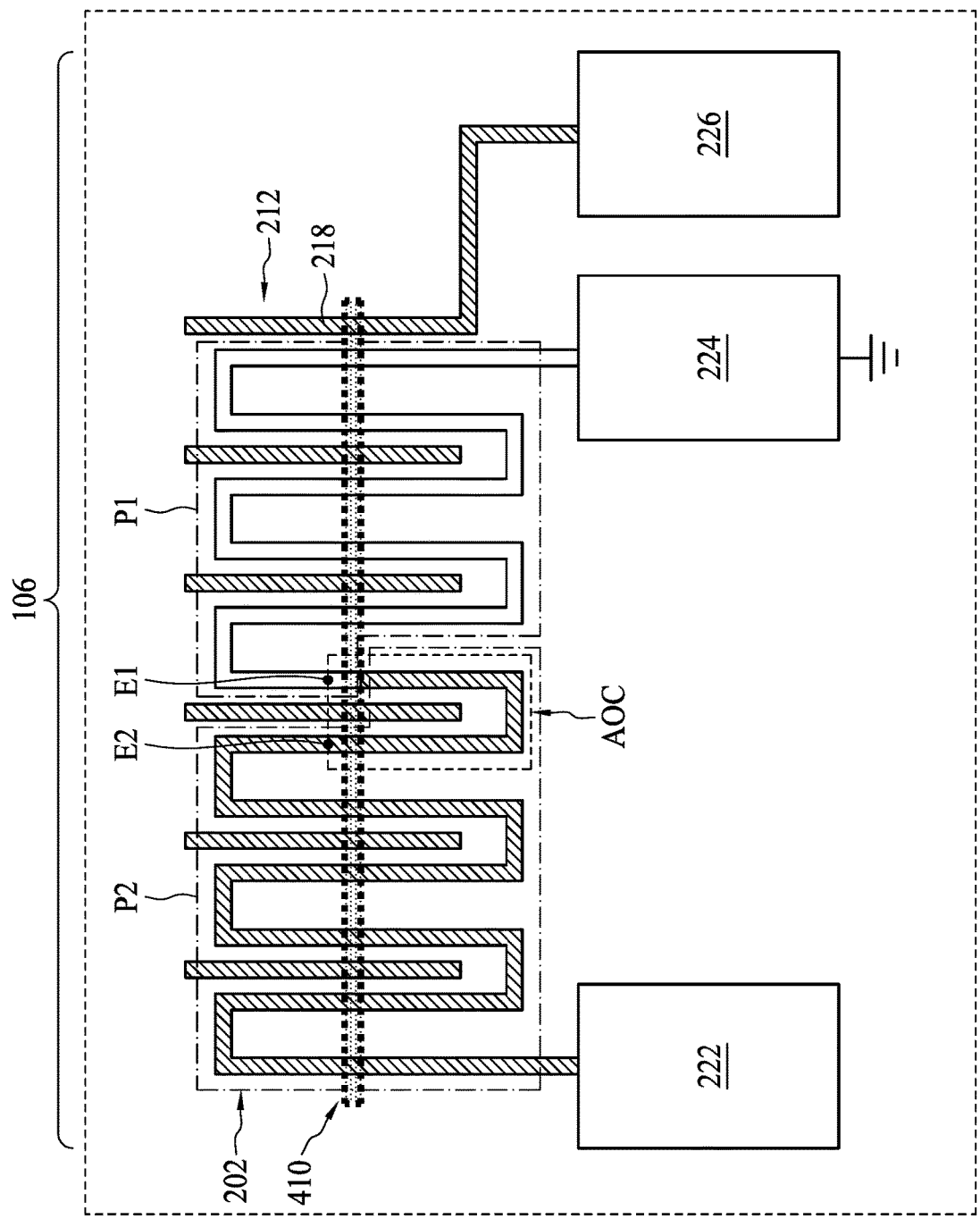
FIGS. 4A to 4D are schematic diagrams showing images of a test pattern, in accordance with some embodiments.
Figure 4B:
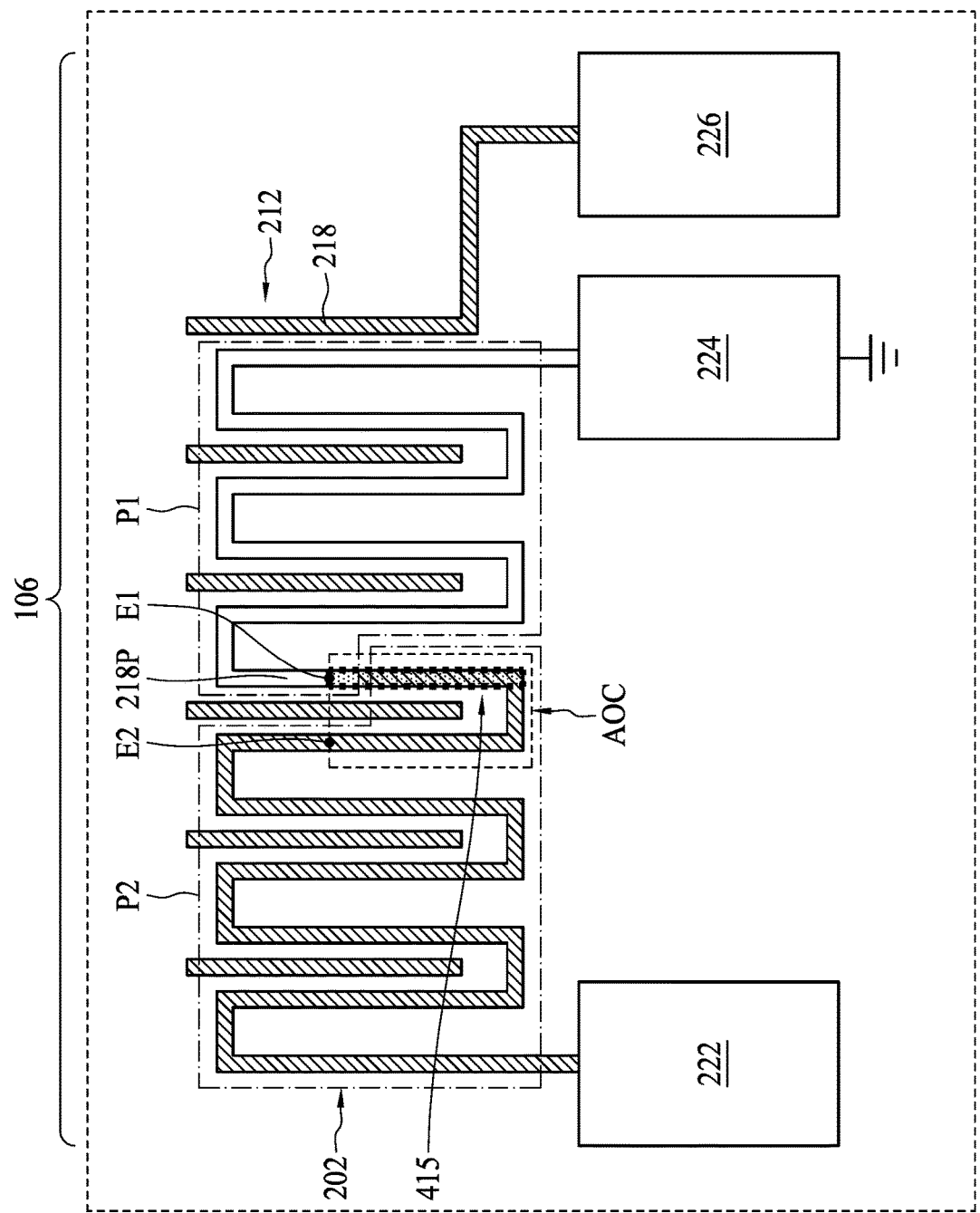

FIG. 4A and FIG. 4B are schematic diagrams showing images 401 of the test pattern 106, in accordance with some embodiments. The image 401 may be formed using the VC scanning mode of the energy source 120 in FIG. 1. The image 401 is formed using a scanning operation, shown in FIG. 3E. Referring to FIG. 4A, an E-beam 410 may be utilized to scan the test pattern 106 while forming the VC scanning image 401. The beam pattern of the E-beam 410 may have a strip shape or a block shape. In the present embodiment, a horizontal strip shape is adopted for the E-beam 410, wherein the E-beam 410 is projected onto the test pattern 106, and the E-beam 410 crosses substantially all of the parallel fingers 208 and 218 of the first conductive trace 202 and the second conductive trace 212, respectively, in a single pass. The entire test pattern 106 is then scanned with repetitive beam strips 410 along the y-axis.

The fingers 208 may serve as a benchmark of the design rules, such as the minimum spacing between conductive lines of the semiconductor devices 102. Assume the first conductive trace 202 includes an open or high-impedance defect in an area AOC (illustrated by a dotted box). As the E-beam 410 scans through the fingers 208 and 218, a first part P1 of the first conductive trace 202 connected to the conductive pad 224 may exhibit a bright shade (expressed as blank segments) in the image 410. The remaining portion of the first conductive trace 202, termed a second part P2, may exhibit a dark shade (expressed as diagonal stripe segments) in the image 410. As discussed previously, since the conductive pad 224 is grounded, any portion of the first conductive trace 202 or second conductive trace 212 that is electrically coupled to the conductive pad 224 (i.e., the first part P1) will receive and absorb free electrons. Meanwhile, a portion of the first conductive trace 202 that does not receive sufficient free electrons supplied by the ground layer 304, e.g., the second part P2, will exhibit a dark shade due to lack of the free electrons. Therefore, the segments in the first part P1 will be illuminated and exhibit a bright shade in the image 401, while the segments in the second part P2 will exhibit a dark shade in the image 401. In an embodiment, the entire first part P1 of the first conductive trace 202 is illuminated because the free electrons run through the entire first part P1.

When a testing engineer inspects the portions of the test pattern 106 intersecting the E-beam 410, he or she will see a sequence of intersecting sections with bright or dark shades. Based on the high contrast ratio between the first part P1 and the second part P2 of the first conductive trace 202, the testing engineer can visually determine that the open-circuit problem is located within the area AOC of the first conductive trace 202. In an embodiment, the area AOC is determined as a visually contiguous portion of the first conductive trace 202 wherein the portion has a first end E1 and a second end E2. The first end E1, connected to the conductive pad 224, exhibits a bright shade, while the second end E2 exhibits a dark shade. Such visually contiguous portion may not be electrically contiguous due to the circuit defects. The examination area can be limited from the entire length of the first conductive trace 202 to the section within the area AOC.

Subsequently, the testing engineer can take additional measures to locate the circuit defect in the section between the first end E1 and the second end E2. For example, as shown in FIG. 4B, the area AOC is further scanned, wherein the E-beam 140 is projected to a portion of the area AOC or the entire area AOC. For example, an E-beam 415 is formed as a vertical strip shape to cover a segment of the problematic finger 208P where the first end E1 resides. It is easily determined whether the circuit defect exists within the area covered by the E-beam 415. By following such a locating approach, the search area is progressively reduced until the circuit defect is found.

Regarding the second conductive trace 212, the segments 214 and 216 of the second conductive trace 212 are not yet formed at the time of the VC scanning operation of the E-beam 410. Thus, only the fingers 218 undergo the examination. In an embodiment, the fingers 218 are arranged in parallel and are electrically isolated from each other. The fingers 218 may be formed to serve as a benchmark of the design rules, such as the minimum line width or line spacing between conductive lines of the semiconductor devices 102. Since none of the fingers 218 is designed to be coupled to the ground layer 304 or the conductive pad 224, the fingers 218 will exhibit a dark shade in an ideal case.

Figure 4C:
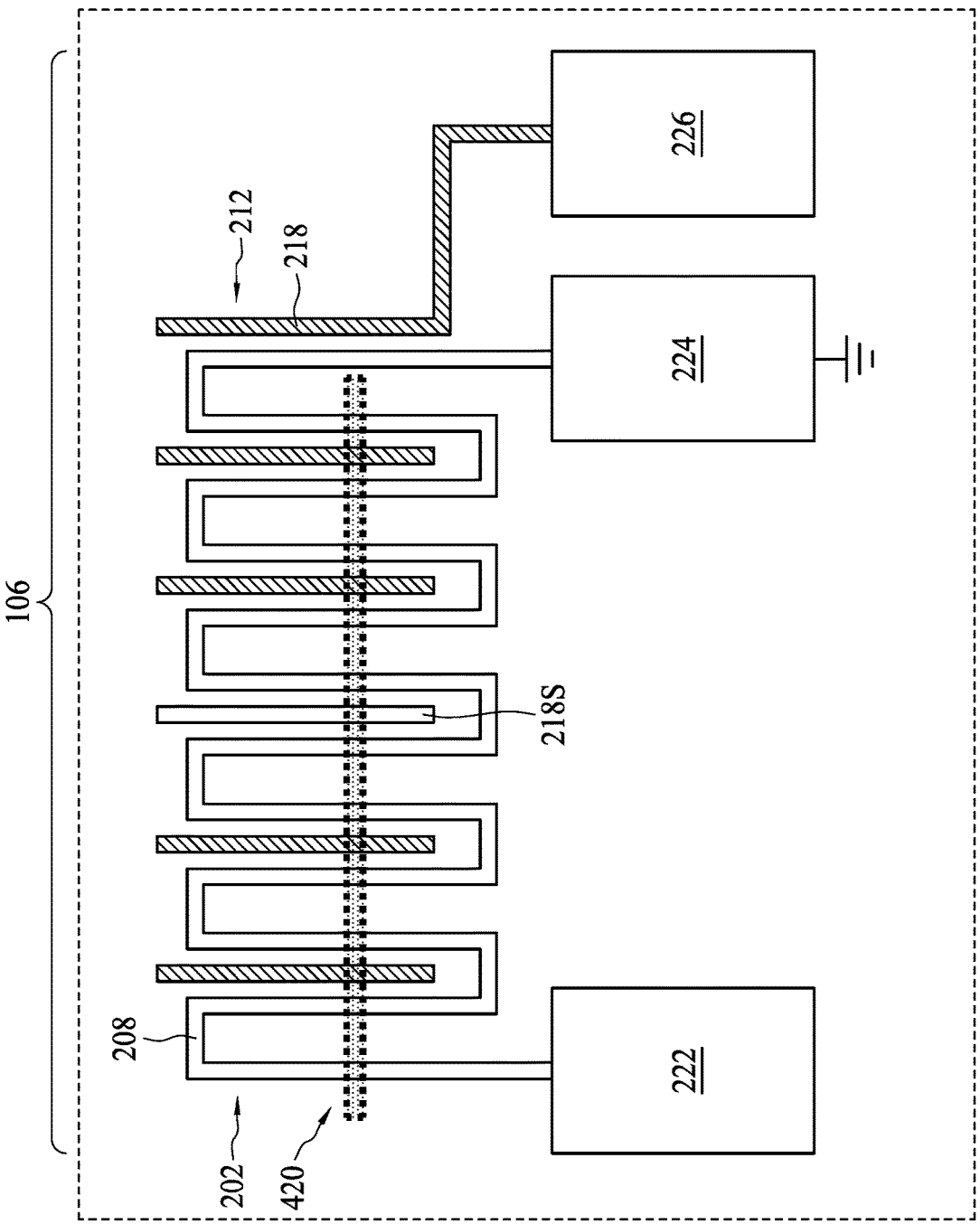
Figure 4D:
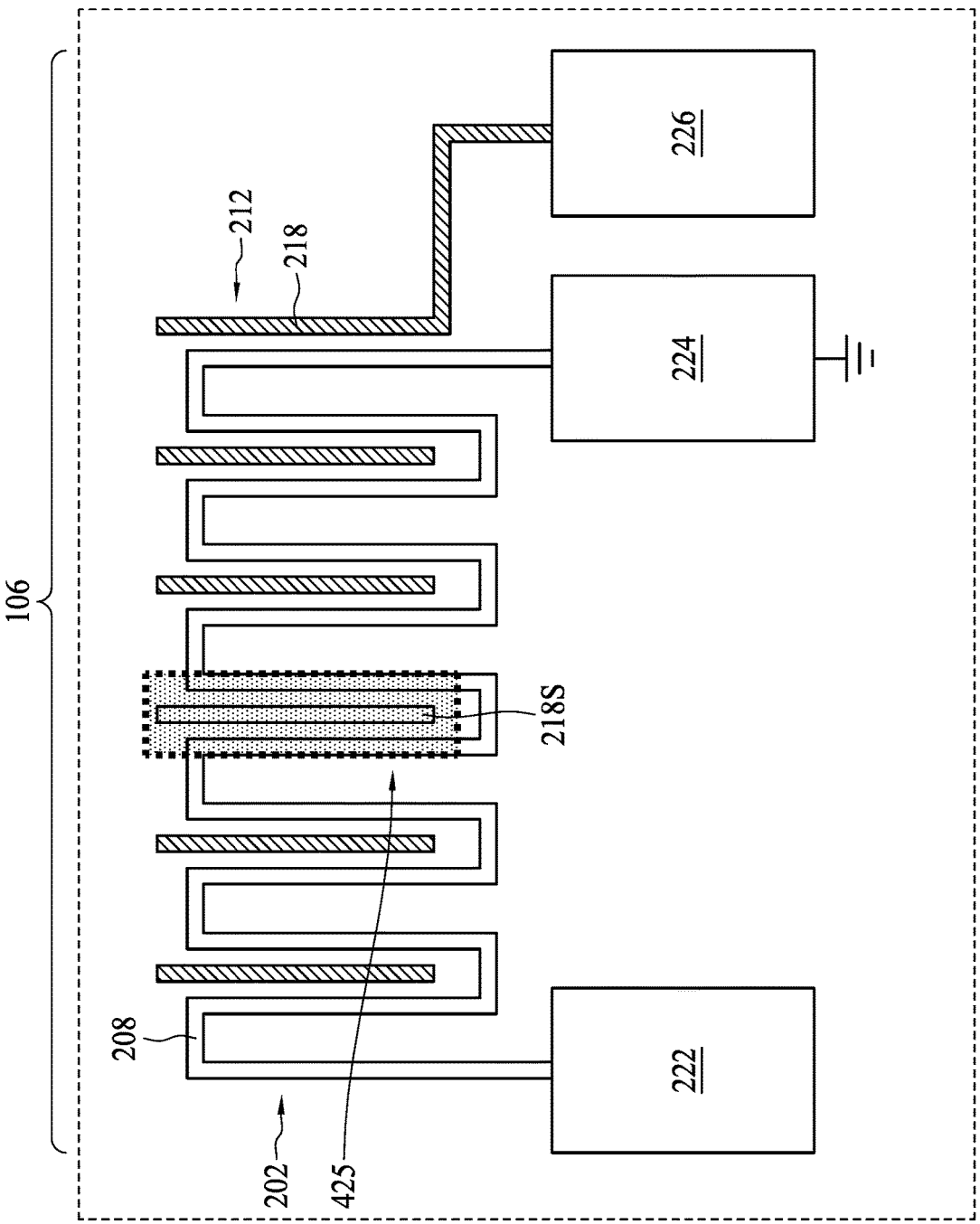

FIGS. 4C and 4D are schematic diagrams showing images 402 of the test pattern 106, in accordance with some embodiments. The image 402 may be generated using the VC scanning mode of the energy source 120 in FIG. 1. The image 402 is generated using the VC scanning operation in FIG. 3E. An E-beam 420 may be utilized to scan the test pattern 106 in generating the image 402. The beam pattern of the E-beam 420 may include a horizontal strip shape similar to that of the E-beam 410. The entire test pattern 106 can be scanned using the scanning strip 420 running across all of the fingers 208 and 218. In the present embodiment, the image 402 reveals that all of the fingers 208 exhibit bright shades throughout the first conductive trace 202. Such bright shades indicate that no open or high-impedance defect occurs in the first conductive trace 202. Moreover, the image 402 shows that a finger 218S exhibits a bright shade, while other fingers 218 exhibit dark shades. The testing engineer can thus determine that only the finger 218S is electrically shorted to its neighboring fingers 208 of the first conductive trace 202 as a result of defective fabrication processes. The examination area can be limited from all of the segments 218 to the area around the finger 218S.

Subsequently, as illustrated in FIG. 4D, the testing engineer can take additional measures to locate the circuit defect around the finger 218S. Because only a small contact area of a short circuit between the finger 218S and a nearby conductive segment is needed to allow free electrons to flow across the entire finger 218S, the VC scanning image may not be adequate to identify the precise location of short circuit. Therefore, a block mode, that generates an enlarged view of each block of the image 402, may be necessary to allow the testing engineer to identify the precise location by obtaining a zoomed-in view of the circuit and examine the geometry or layout around the finger 218S. An E-beam 425, formed as having a block shape, is projected to cover the finger 218S and its surroundings. As compared to the scanning method for the first conductive trace 202 using only the VC scanning image 401, the fault detection of the second conductive trace 212 in FIG. 4D may further involve a visual inspection step with the physical mode.

Figure 5:
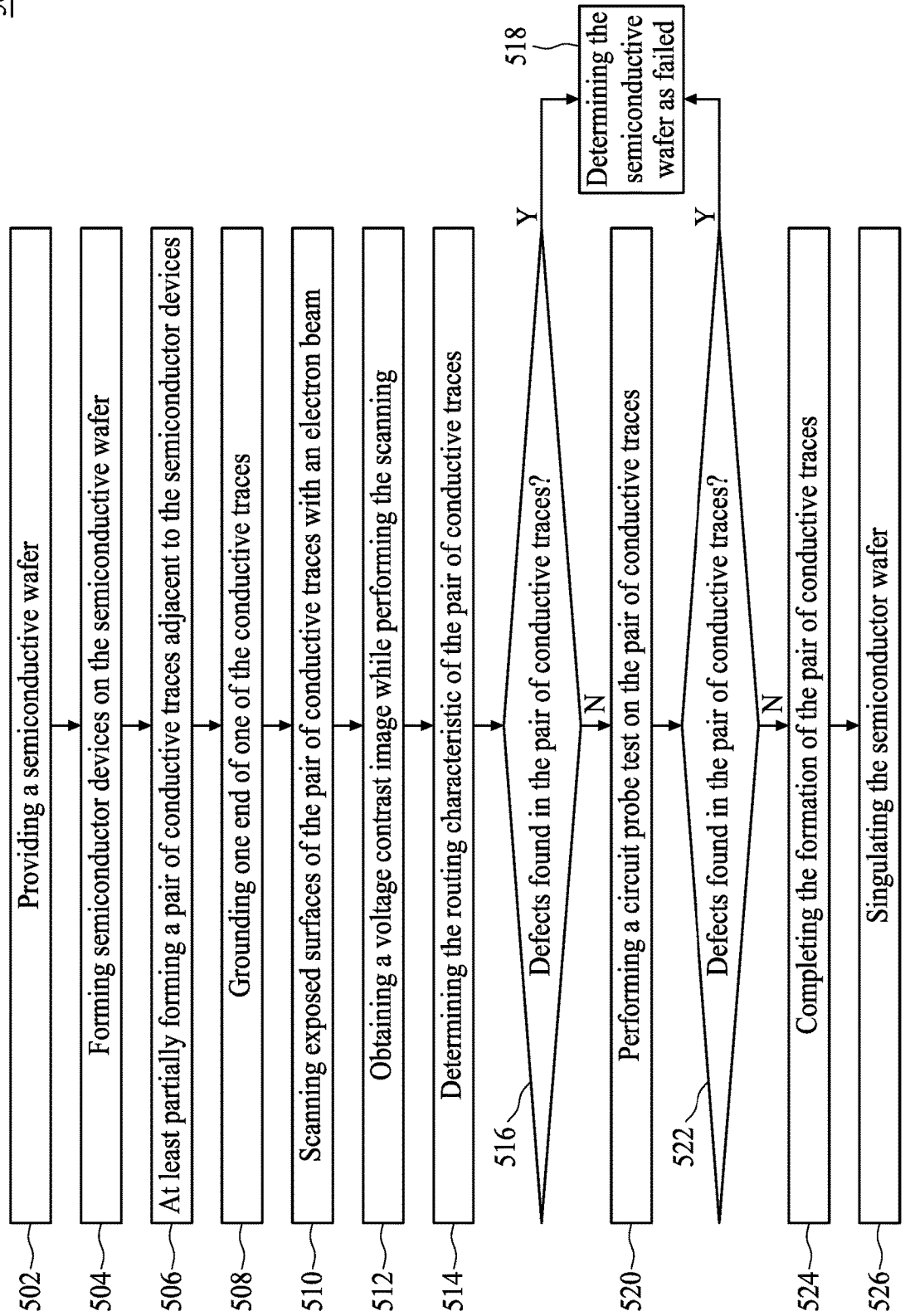
FIG. 5 is a flowchart showing a testing method in accordance with some embodiments.

FIG. 5 is a flowchart showing a testing method 500 in accordance with some embodiments. At step 502, a semiconductor wafer is provided. At step 504, a plurality of semiconductor devices are formed on the semiconductor wafer. In an embodiment, the semiconductor wafer includes a scribe line area formed as a grid and the semiconductor devices are separated by the scribe line area. At step 506, a pair of alternately arranged, spaced-apart conductive traces is at least partially formed adjacent to the semiconductor devices. In an embodiment, only one of the pair of conductive traces is completed while the other is not completed yet. In an embodiment, the pair of alternately arranged, spaced-apart conductive traces are formed in the scribe line area.

At step 508, one end of one of the conductive traces is grounded. In an embodiment, the grounding is performed by electrically coupling the end of the one of the conductive traces to a ground layer in the semiconductor wafer. In an embodiment, the grounded end is selected to be compatible with a subsequent circuit probe (CP) test.

At step 510, exposed surfaces of the pair of conductive traces are scanned with an E-beam. At step 512, a voltage contrast (VC) scanning image is obtained while the scanning is performed. At step 514, the routing characteristic, such as an open defect or short circuit, of the pair of conductive traces is determined.

At step 516, it is determined whether any defects are found in the pair of conductive traces. If affirmative, the semiconductor wafer is determined as failed at step 518. The semiconductor wafer may be discarded and the method 500 may return back to step 502 for initiating another round of wafer fabrication. If it is determined that no circuit defects are detected, a CP test is performed on the conductive traces at step 520.

At step 522, it is determined whether any defects are found in the pair of conductive traces. If affirmative, the semiconductor wafer is determined as failed at step 518. The semiconductor wafer may be discarded and the method 500 may return back to step 502 for initiating another round of wafer fabrication. If it is determined that no circuit defects are detected, the formation of the pair of conductive traces is continued and completed at step 524.

At step 526, when the manufacturing and testing operations have been completed, the semiconductor wafer is singulated into individual dies. In an embodiment, the singulation is performed by cutting through the scribe line area such that at least a portion of the pair of conductive traces is removed. In an embodiment, the scribe line area or the pair of conductive traces are removed by the singulation operation.

According to an embodiment, a method includes the following steps: coupling a first end of a first conductive trace to a free electron source; scanning exposed surfaces of the first and a second conductive traces with an electron beam, the first conductive trace and a second conductive trace being alternately arranged and spaced apart; obtaining an image of the first conductive trace and the second conductive trace while performing the scanning; and determining a routing characteristic of the first conductive trace and the second conductive trace based on the image.

According to an embodiment, a method includes the following steps: forming the first conductive trace and the second conductive trace; depositing a first pad and a second pad on two ends of the first conductive trace; grounding the first pad; scanning the first conductive trace and the second conductive trace with an electron beam; obtaining an image of the first conductive trace and the second conductive trace while performing the scanning; and determining the routing characteristic of the first conductive trace and the second conductive trace based on the image.

According to an embodiment, a method includes the following steps: forming a first conductive trace; forming a portion of a second conductive trace, the first conductive trace and the portion of the second conductive trace being alternately arranged and spaced apart; depositing a first pad and a second pad on two ends of the first conductive trace; coupling the first pad to an electron source; scanning the first conductive trace and portion of the second conductive trace with an electron beam; obtaining an image of the first conductive trace and the second conductive trace while performing the scanning; determining a routing characteristic of the first conductive trace and the second conductive trace based on the image; and forming another portion of the second conductive trace to complete the second conductive trace.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    depositing a conductive layer in an interconnect structure over a semiconductor wafer, wherein the conductive layer is configured as ground;
    forming a first conductive trace and a second conductive trace over the conductive layer and coupling a first end of the first conductive trace to the conductive layer;
    performing a first scanning on exposed surfaces of the first conductive trace and the second conductive trace with a first electron beam, the first conductive trace and the second conductive trace being alternately arranged and spaced apart;
    obtaining an image of the first conductive trace and the second conductive trace while performing the first scanning;
    determining a routing characteristic of the first conductive trace and the second conductive trace based on the image;
    in response to determining that no defects are found in the first conductive trace and the second conductive trace, forming a third conductive trace in a second tier of the interconnect structure, the third conductive trace electrically connecting disconnected segments of the second conductive trace;
    performing a second scanning on an exposed surface of the third conductive trace with a second electron beam; and
    determining a routing characteristic of the second conductive trace and the third conductive trace based on the second scanning.

2. The method according to claim 1, wherein performing the first scanning on the exposed surfaces of the first and second conductive traces with the first electron beam comprises crossing all of parallel fingers of the first and the second conductive traces.

3. The method according to claim 1, wherein determining a routing characteristic of the first conductive trace and the second conductive trace comprises detecting whether an open circuit or a high-impedance defect exists in the first conductive trace.

4. The method according to claim 3, wherein determining a routing characteristic of the first conductive trace and the second conductive trace based on the image comprises identifying a section including the open circuit or the high-impedance defect, the section having a first end with a bright shade and a second end having a dark shade.

5. The method according to claim 4, wherein the first end of the section is connected to the first end of the first conductive trace.

6. The method according to claim 1, wherein determining a routing characteristic of the first conductive trace and the second conductive trace comprises detecting whether a short circuit exists between the first conductive trace and the second conductive trace.

7. The method according to claim 6, wherein the second conductive trace comprises a plurality of electrically disconnected fingers interleaved with the first conductive trace prior to performing the first scanning on the exposed surfaces of the first and the second conductive trace with the first electron beam.

8. The method according to claim 7, wherein the short circuit between the first conductive trace and the second conductive trace is detected in response to an image of at least one of the electrically disconnected fingers of the second conductive trace exhibiting a bright shade.

9. The method according to claim 1, wherein the first conductive trace and the second conductive trace are formed in a scribe line area of the semiconductor wafer prior to performing the first scanning on the exposed surfaces of the first and the second conductive traces.

10. The method according to claim 9, further comprising singulating the semiconductor wafer by removing the scribe line area from the semiconductor wafer.

11. The method according to claim 1, further comprising testing the first conductive trace and the second conductive trace using a probe device in response to determining that no defects are found in the first and the second conductive traces.

12. The method according to claim 11, wherein testing the first conductive trace and the second conductive trace using a probe device comprises applying a low voltage and a high voltage on the first end and a second end opposite to the first end of the first conductive trace.

13. A method, comprising:
    depositing a conductive layer in a first tier of an interconnect layer over a semiconductor wafer, the conductive layer being configured as ground;
    forming a first conductive via in a second tier over the first tier;
    forming a first conductive trace and a second conductive trace in a third tier over the second tier, the first conductive trace comprising a plurality of connected first fingers and the second conductive trace comprising a plurality of disconnected second fingers;
    depositing a first pad and a second pad in the third tier on two ends of the first conductive trace;
    grounding the first pad by electrically connecting the first pad to the conductive layer through the first conductive via;
    performing a first scanning on the first conductive trace and the second conductive trace with a first electron beam;
    obtaining an image of the first conductive trace and the second conductive trace while performing the first scanning;
    determining a routing characteristic of the first conductive trace and the second conductive trace based on the image;
    in response to determining that no defects are found in the first conductive trace and the second conductive trace, forming a third conductive trace in a third tier over the second tier to electrically interconnect the disconnected second fingers of the second conductive trace;
    performing a second scanning on exposed surfaces of the third conductive trace with a second electron beam; and
    determining a routing characteristic of the second conductive trace and the third conductive trace based on the second scanning.

14. The method according to claim 13, further comprising depositing a third pad in a fourth tier between the second tier and the third tier, wherein grounding the first pad further comprises electrically coupling the first pad to the conductive layer through the third pad.

15. The method according to claim 14, further comprising forming a fifth conductive trace in the fourth tier in a direction perpendicular to the plurality of connected first fingers, wherein forming the first conductive trace comprises electrically connecting the plurality of first fingers of the first conductive trace to the fifth conductive trace.

16. The method according to claim 13, further comprising forming a fourth pad on one end of the second conductive trace.

17. The method according to claim 16, further comprising, in response to determining that no defects are found in the first conductive trace and the second conductive trace, applying a test probe to the second pad and the fourth pad.

18. A method, comprising:
depositing a conductive layer as ground over a semiconductor wafer,
forming a first conductive trace;
forming a first portion of a second conductive trace, the first conductive trace and the first portion of the second conductive trace being alternately arranged and spaced apart, the first portion comprising disconnected fingers parallel to the first conductive trace;
depositing a first pad and a second pad on two ends of the first conductive trace;
coupling the first pad to a free electron source;
performing a first scanning on the first conductive trace and the first portion of the second conductive trace with a first electron beam;
obtaining an image of the first conductive trace and the second conductive trace while performing the first scanning;
determining a routing characteristic of the first conductive trace and the second conductive trace based on the image;
in response to determining that the routing characteristic of the first conductive trace and the second conductive trace conforms to design rules, forming a second portion of the second conductive trace to complete the second conductive trace, the second portion electrically interconnecting the disconnected fingers; and
performing a second scanning on the completed second conductive trace with a second electron beam and determining a routing characteristic of the completed second conductive trace.

19. The method according to claim 18, wherein coupling the first pad to an electron source comprises coupling the free electron source to a ground layer.

20. The method according to claim 18, further comprising:
forming a plurality of semiconductor devices in the semiconductor wafer, wherein the first conductive trace and the second conductive trace are formed over the semiconductor wafer in a scribe line area separating the semiconductor devices; and
in response to determining that the routing characteristic of the completed second conductive trace conforms to the design rules, separating the semiconductor devices into individual dies by cutting through the scribe line area and removing the first and second conductive traces.

* * * * *